US011837776B2

(12) United States Patent
Lee et al.

(10) Patent No.: US 11,837,776 B2
(45) Date of Patent: Dec. 5, 2023

(54) ELECTRONIC DEVICE

(71) Applicant: SAMSUNG DISPLAY CO., LTD., Yongin-si (KR)

(72) Inventors: Seongryong Lee, Hwaseong-si (KR); Jae-Kyoung Kim, Hwaseong-si (KR); Eunjin Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 17 days.

(21) Appl. No.: 17/362,918

(22) Filed: Jun. 29, 2021

(65) Prior Publication Data

US 2022/0115767 A1 Apr. 14, 2022

(30) Foreign Application Priority Data

Oct. 14, 2020 (KR) ........................ 10-2020-0132946

(51) Int. Cl.
*G06F 3/041* (2006.01)
*H01Q 1/24* (2006.01)
*G06F 3/044* (2006.01)
*H10K 50/84* (2023.01)
*H10K 59/40* (2023.01)

(52) U.S. Cl.
CPC ........... *H01Q 1/243* (2013.01); *G06F 3/0412* (2013.01); *G06F 3/0445* (2019.05); *G06F 3/0446* (2019.05); *H10K 50/84* (2023.02); *H10K 59/40* (2023.02)

(58) Field of Classification Search
None
See application file for complete search history.

(56) References Cited

U.S. PATENT DOCUMENTS

| | | |
|---|---|---|
| 10,530,040 B2 | 1/2020 | Cai et al. |
| 10,854,968 B2 | 12/2020 | Zhou et al. |
| 2016/0093939 A1 | 3/2016 | Kim et al. |
| 2018/0034130 A1 | 2/2018 | Jang |
| 2018/0203562 A1 | 7/2018 | An et al. |

(Continued)

FOREIGN PATENT DOCUMENTS

| CN | 109411873 A | * 3/2019 | ............... H01Q 1/22 |
|---|---|---|---|
| KR | 10-2018-0014296 | 2/2018 | |
| KR | 10-2019-0029438 | 3/2019 | |

(Continued)

OTHER PUBLICATIONS

Translation of KR 102150998 B1 into English, Kim et al. (Year: 2020).*

(Continued)

*Primary Examiner* — Brian M Butcher
(74) *Attorney, Agent, or Firm* — F. CHAU & ASSOCIATES, LLC

(57) ABSTRACT

An electronic device includes a display layer including an active area and a peripheral area adjacent to the active area. An antenna layer is disposed on the display layer and includes an antenna, an antenna line connected to one side of the antenna, and an antenna pad connected to one side of the antenna line. A cover layer is spaced apart from the antenna layer with the display layer disposed therebetween. The cover layer may at least partially overlap each of the antenna, the antenna line, and the antenna pad.

24 Claims, 15 Drawing Sheets

(56) References Cited

U.S. PATENT DOCUMENTS

| | | | |
|---|---|---|---|
| 2019/0113609 A1* | 4/2019 | Baheti | H01Q 9/0457 |
| 2020/0383247 A1 | 12/2020 | Jin et al. | |

FOREIGN PATENT DOCUMENTS

| | | |
|---|---|---|
| KR | 10-2019-0060305 | 6/2019 |
| KR | 10-2035689 | 10/2019 |
| KR | 10-2099753 | 4/2020 |
| KR | 10-2099830 | 4/2020 |
| KR | 10-2020-0068904 | 6/2020 |
| KR | 102150998 B1 * | 9/2020 |

OTHER PUBLICATIONS

Translation of CN 109411873 A into English, Zheng et al. (Year: 2019).*

Park, et al., An Optically Invisible Antenna-on-Display Concept for Millimeter-Wave 5G Cellular Devices, IEEE Transaction on Antennas and Propagation, vol. 67 No. 5 May 2019, pp. 2942-2952.

"Wei Chen, et al., Spectral-Domain Moment—Method Analysis of Coplanar Microstrip Parasitic Subarrays," Microwave and Optical Technology Letters, vol. 6. No. 3. Mar. 5, 1993.

Mekala Harinath Reddy, et al., "Bandwidth Enhancement of Microstrip Patch Antenna Using Parasitic Patch," 2017 IEEE International Conference on Smart Technologies and Management for Computing, Communication, Controls, Energy and Materials (ICSTM), Veltch DR, RR & DR, SR University, Chennai T.N., India. Aug. 2-4, 2017, pp. 295-298.

Syamimi Mohd Norzeli, et al., "Design of High Gain Migrostrip Patch Reader Array Antenna With Parasitic Elements for UHF RFID Application," International Journal of Engineering & Technology, 7 (4.35) (2018) 463-467.

* cited by examiner

ELECTRONIC DEVICE

CROSS-REFERENCE TO RELATED APPLICATIONS

This U.S. non-provisional patent application claims priority under 35 U.S.C. § 119 to Korean Patent Application No. 10-2020-0132946, filed on Oct. 14, 2020, the entire contents of which are hereby incorporated by reference.

TECHNICAL FIELD

The present disclosure herein relates to an electronic device and, more particularly, to an electronic device having an antenna layer.

DISCUSSION OF THE RELATED ART

Electronic devices may include various electronic modules. For example, electronic devices such as mobile terminals or wearable devices, may include antenna modules, camera modules, and/or battery modules. Mobile terminals are being reduced in thickness and wearable devices are being reduced in size. This may make it difficult to find adequate space within the electronic devices for all of the needed electronic modules. In addition, more electronic modules are being added to electronic devices.

SUMMARY

An electronic device includes a display layer including an active area and a peripheral area adjacent to the active area. An antenna layer is disposed on the display layer and includes an antenna, an antenna line connected to one side of the antenna, and an antenna pad connected to one side of the antenna line. A cover layer is spaced apart from the antenna layer with the display layer therebetween. When viewed on a plane, the cover layer may at least partially overlap each of the antenna, the antenna line, and the antenna pad.

The peripheral area may include a first area adjacent to the active area and a second area spaced apart from the active area with the first area disposed therebetween. The display layer may include a common electrode at least partially overlapping the active area and the first area.

The common electrode may overlap at least a portion of each of the antenna and the antenna line.

When viewed on a plane, the cover layer may at least partially overlap each of the active area, the first area, and the second area.

When viewed on a plane, the common electrode may be spaced apart from the second area.

The electronic device may further include a protective layer disposed between the display layer and the cover layer.

The cover layer may be disposed directly on a lower surface of the protective layer.

The electronic device may further include a cushion layer disposed between the protective layer and the cover layer.

The electronic device may further include a sensor layer disposed between the display layer and the antenna layer. The sensor layer may include a plurality of sensing electrodes.

The sensor layer may further include a dummy electrode at least partially overlapping a peripheral area. The dummy electrode may overlap at least a portion of the antenna line.

The antenna may be disposed on the same layer as at least some of the plurality of sensing electrodes.

The antenna may at least partially overlap the active area, and the antenna line and the antenna pad may at least partially overlap the peripheral area.

The cover layer may be electrically conductive.

The cover layer may include copper.

The cover layer may include a first portion at least partially overlapping the antenna and a second portion extending from the first portion and at least partially overlapping each of the antenna line and the antenna pad. The first portion may include a non-electrically conductive material, and the second portion may include an electrically conductive material.

An electronic device includes an antenna layer having an antenna, an antenna line connected to one side of the antenna, and an antenna pad connected to one side of the antenna line, a display layer disposed below the antenna layer and including a common electrode provided with a first ground voltage, and a cover layer disposed below the display layer and at least partially overlapping each of the antenna, the antenna line, and the antenna pad. The cover layer may be provided with a second ground voltage, or the cover layer may be electrically floated.

The cover layer may include copper.

The electronic device may further include a protective layer disposed between the display layer and the cover layer. The cover layer may be disposed directly on a lower surface of the protective layer.

The cover layer may include a first portion and a second portion adjacent to the first portion. The second portion may be electrically conductive. When viewed on a plane, the second portion may at least partially overlap each of the antenna line and the antenna pad.

The electronic device may further include a sensor layer disposed between the display layer and the antenna layer. The sensor layer may include a plurality of sensing electrodes at least partially overlapping the active area. A dummy electrode at least partially overlaps the peripheral area. The dummy electrode may overlap at least a portion of the antenna line.

An electronic device includes an antenna layer having an antenna, an antenna line connected to one side of the antenna, and an antenna pad connected to one side of the antenna line. A display layer is disposed below the antenna layer and includes a common electrode overlapping at least a portion of the antenna and the antenna line. A protective layer is disposed below the display layer. A cover layer is disposed directly below the protective layer, when viewed on a plane, at least partially overlapping each of the common electrode, the antenna line, and the antenna pad.

The cover layer may at least partially overlap each of the antenna, the antenna line, and the antenna pad.

The electronic device may further include a sensor layer disposed between the display layer and the antenna layer and may include a plurality of sensing electrodes.

The antenna may have a mesh structure.

The cover layer may be electrically conductive.

The display layer may include a common electrode overlapping at least a portion of the antenna and the antenna line.

An electronic device includes a display panel including an active area and a peripheral area at least partially surrounding the active area. An antenna is disposed on the display layer. An antenna pad is disposed on a first side of the antenna. An antenna line is disposed on a second side of the antenna, opposite to the first side. A cover layer overlaps at least a portion of each of the antenna, the antenna pad, and the antenna line.

The display panel may be disposed between the antenna and the cover.

The cover layer may be grounded or floated.

The electronic device may further include a flexible circuit board contacting the antenna pad and electrically connecting the antenna pad to a beam forming chip mounted thereon. The antenna may include a plurality of antennas. The beam forming chip may be configured to control the plurality of antennas to focus frequency signals in a specific direction.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
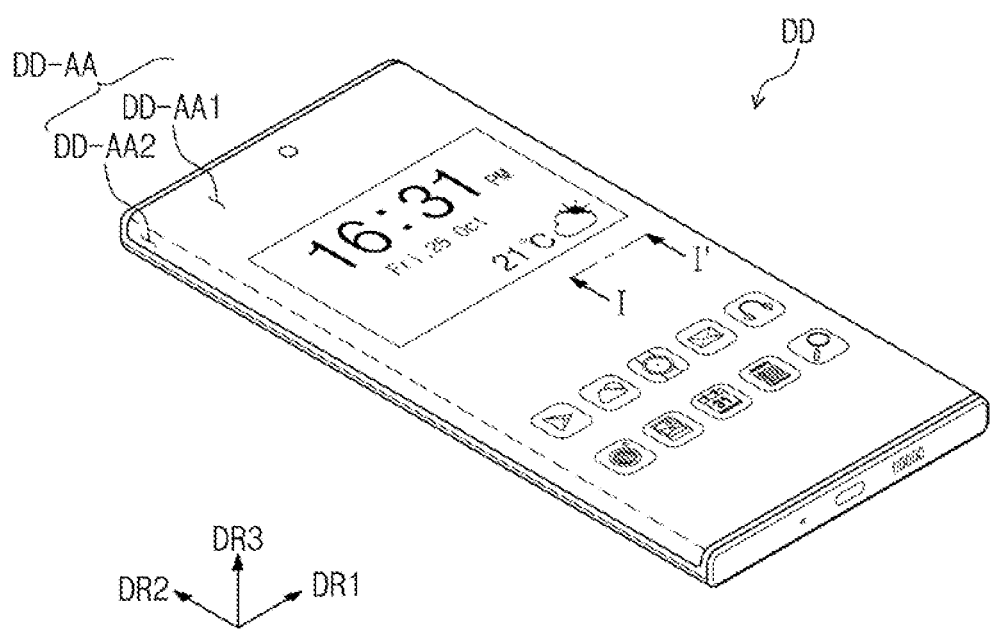
FIG. 1 is a perspective view illustrating an electronic device according to an embodiment of the inventive concept.

In the present description, when an element (or a region, a layer, a portion, etc.) is referred to as being "on," "connected to," or "coupled to" another element, it means that the element may be disposed directly on/connected to/coupled to the other element, or that a third element may be disposed therebetween.

Like reference numerals may refer to like elements throughout the specification and the drawings. Also, in the drawings, the thickness, the ratio, and the dimensions of elements may be exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the inventive concept will be described with reference to the accompanying drawings.

FIG. 1 is a perspective view illustrating an electronic device according to an embodiment of the inventive concept.

Referring to FIG. 1, an electronic device DD may be a device activated according to electrical signals. For example, the electronic device DD may be a mobile phone, a tablet computer, a vehicle satellite navigation system, a portable game console, or a wearable device, but the present invention is not necessarily limited thereto. In FIG. 1A a mobile phone is illustrated as the electronic device DD.

The electronic device DD may display images through an active area DD-AA. In the active area DD-AA, a first display surface DD-AA1 parallel to a plane defined by the first direction DR1 and the second direction DR2 crossing the first direction DR1 and a second display surface DD-AA2 extending from the first display surface DD-AA1 may be defined.

The second display surface DD-AA2 may be bent from one side of the first display surface DD-AA1. Alternatively, the second display surfaces DD-AA2 may be provided in plural. In this case, second display surfaces DD-AA2 may be bent from at least two sides of the first display surface DD-AA1. In the active area DD-AA, one first display surface DD-AA1 and one to four second display surfaces DD-AA2 may be defined. However, the shape of the active area DD-AA is not necessarily limited thereto, and only the first display surface DD-AA1 might be defined in the active area DD-AA.

A thickness direction of the electronic device DD may be parallel to a third direction DR3 crossing the first direction DR1 and the second direction DR2. Therefore, a front surface (e.g., an upper surface) and a rear surface (e.g., a lower surface) of members constituting the electronic device DD may be defined with respect to the third direction DR3.

Figure 2:
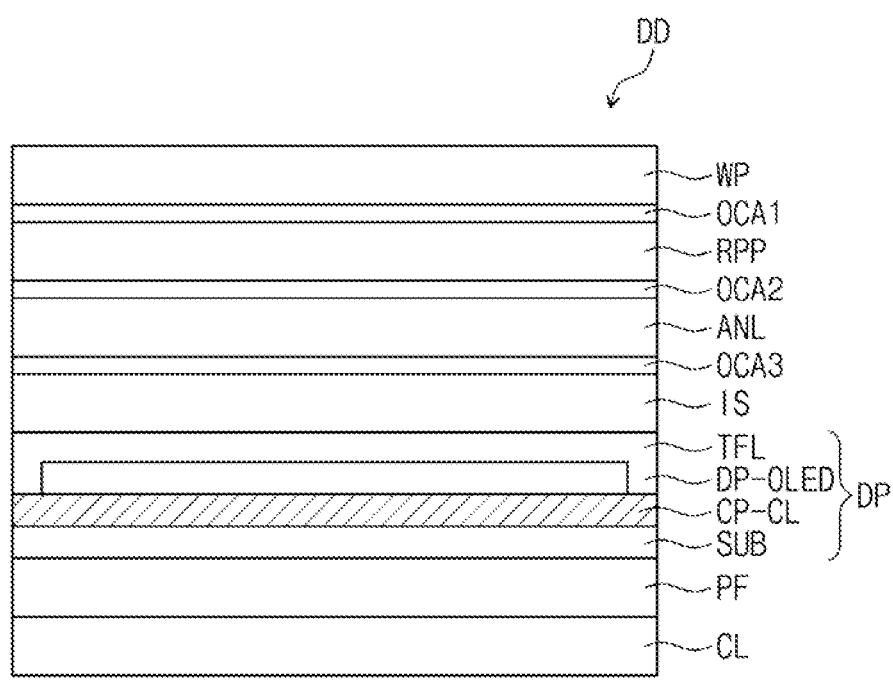
FIG. 2 is a schematic cross-sectional view illustrating an electronic device according to an embodiment of the inventive concept.
Figure 2:
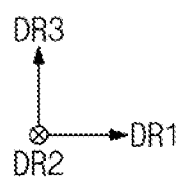

FIG. 2 is a schematic cross-sectional view illustrating an electronic device according to an embodiment of the inventive concept.

Referring to FIG. 2, the electronic device DD may include a window WP, adhesive layers OCA1, OCA2, and OCA3, an anti-reflection layer RPP, an antenna layer ANL, a sensor layer IS, a display layer DP, a protective layer PF, and a cover layer CL.

The window WP may form an exterior of the electronic device DD. The window WP may protect components placed inside the electronic device DD from external shocks, and may be substantially configured to provide an active area DD-AA of the electronic device DD. For example, the window WP may include a glass substrate, a sapphire substrate, or a plastic film. The window WP may have a multilayer structure or a single layer structure. For example, the window WP may have a stacked structure of a plurality of plastic films bonded together by an adhesive, or may have a stacked structure of a glass substrate and a plastic film bonded together by an adhesive.

The adhesive layer OCA1 may be disposed below the window WP. The window WP and the anti-reflection layer RPP may be bonded to each other by the adhesive layer OCA1. The adhesive layer OCA1 may include a conventional adhesive or a gluing agent. For example, the adhesive layer OCA1 may be an optically clear adhesive film, an optically clear resin, or a pressure sensitive adhesive film.

The anti-reflection layer RPP may be disposed below the window WP. The anti-reflection layer RPP may reduce reflectance of natural light (e.g., sunlight) incident from the top of the window WP. The anti-reflection layer RPP, according to an embodiment of the inventive concept, may include a retarder and a polarizer. The retarder may be a film type or a liquid crystal coating type, and may include a half-wave ($\lambda/2$) retarder and/or a quarter-wave ($\lambda/4$) retarder. The polarizer may be a film type or a liquid crystal coating type. The film type may include a stretchable synthetic resin film, and the liquid crystal coating type may include liquid crystals arranged in a predetermined arrangement. The retarder and the polarizer may further include a protective film. The retarder and the polarizer itself or the protective film may be defined as a base layer of the anti-reflection layer RPP.

The adhesive layer OCA2 may be disposed below the anti-reflection layer RPP. The anti-reflection layer RPP and the antenna layer ANL may be bonded together by the adhesive layer OCA2. The adhesive layer OCA2 may include substantially the same material as the adhesive layer OCA1.

The antenna layer ANL may transmit, receive, or both transmit and receive wireless communication signals, for example, radio frequency signals. The antenna layer ANL may include a plurality of antennas, a plurality of antenna lines, and/or a plurality of antenna pads. The plurality of antennas may transmit, receive, or transmit/receive the same frequency bands, or transmit, receive, or transmit/receive different frequency bands. The plurality of antennas, the plurality of antenna lines, and the plurality of antenna pads is described below.

The adhesive layer OCA3 may be disposed below the antenna layer ANL. The antenna layer ANL and the sensor layer IS may be bonded together by the adhesive layer OCA3. The adhesive layer OCA3 may include substantially the same material as the adhesive layer OCA1.

The sensor layer IS may obtain coordinate information pertaining to a location of external inputs (e.g., touches). The sensor layer IS, according to an embodiment of the inventive concept, may be disposed directly on one surface of the display layer DP. For example, the sensor layer IS may be integrated with the display layer DP through an on-cell method. The sensor layer IS may be manufactured along with the display layer DP through a single continuous process. However, the present invention is not necessarily limited thereto, and the sensor layer IS may be manufactured through a separate process and bonded to the display layer DP. The sensor layer IS may include a touch panel.

The display layer DP may be disposed below the sensor layer IS. The display layer DP may be configured to display images. The display layer DP may be a light emitting display layer, but the present invention is not necessarily limited to this type of display layer. For example, the display layer DP may be an organic light emitting display layer, a quantum dot display layer, a micro LED display layer, or a nano LED display layer. The display layer DP may include a base layer SUB, a display circuit layer DP-CL, an image realization layer DP-OLED, and a thin film encapsulation layer TFL. The descriptions thereof is provided below.

The protective layer PF may be disposed below the display layer DP. The protective layer PF may protect a lower surface of the display layer DP. The protective layer PF may include polyethylene terephthalate (PET). However, the material of the protective layer PF is not particularly limited thereto.

The cover layer CL may be disposed below the protective layer PF. The cover layer CL may be electrically conductive. For example, the cover layer CL may include copper (Cu). For example, the cover layer CL may be a copper tape. However, the embodiment of the inventive concept is not particularly limited thereto. A ground voltage may be applied to the cover layer CL. However, this is presented as an example and the cover layer CL may be floating. The descriptions thereof is provided below.

Figure 3:
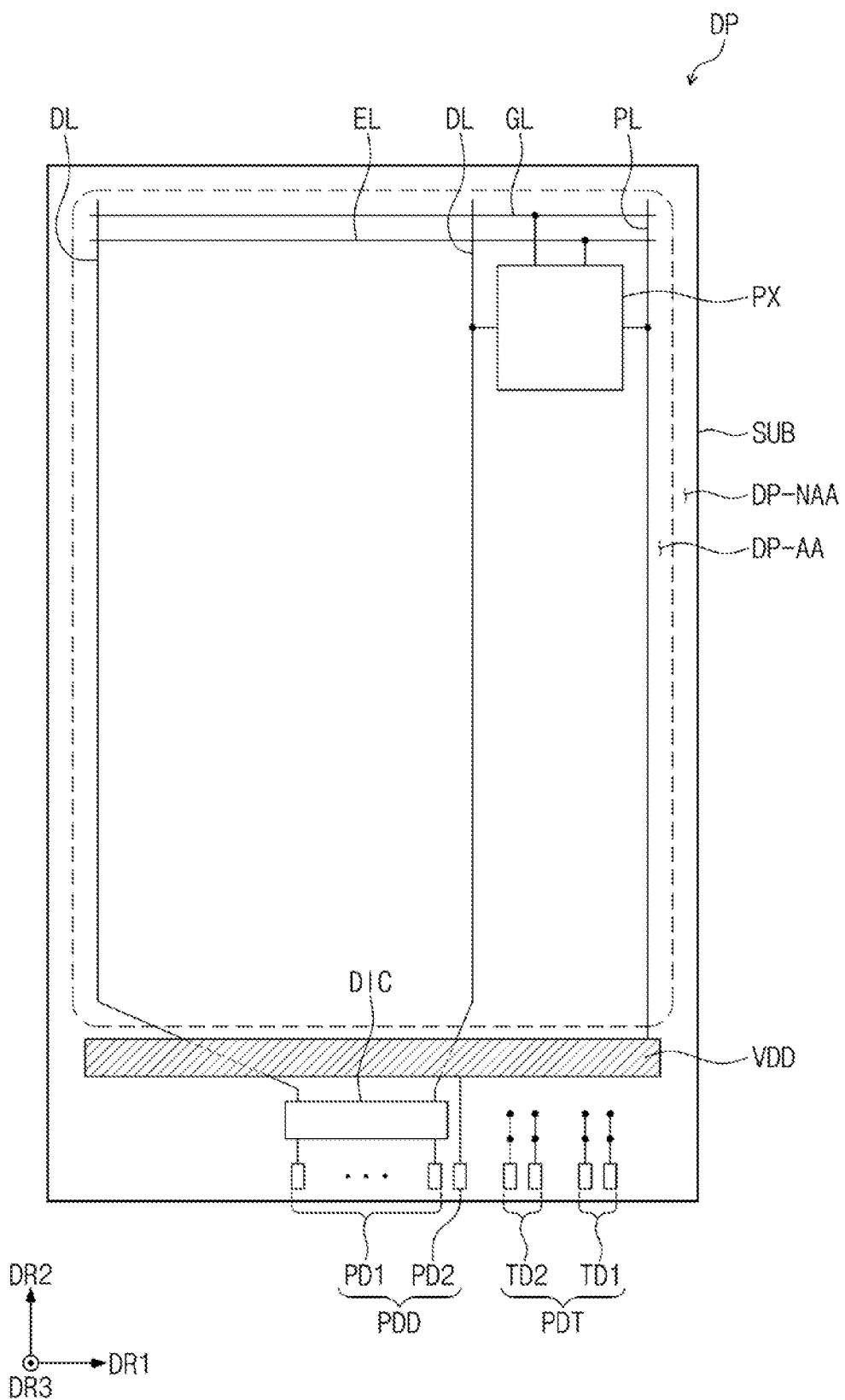
FIG. 3 is a plan view illustrating a display layer according to an embodiment of the inventive concept.

FIG. 3 is a plan view of a display layer according to an embodiment of the inventive concept.

Referring to FIG. 3, an active area DP-AA and a peripheral area DP-NAA adjacent to the active area DP-AA may be defined in the display layer DP. The active area DP-AA may be an area in which images are displayed. A plurality of pixels PX may be disposed in the active area DP-AA. The peripheral area DP-NAA may be an area in which a driving circuit or driving wiring is disposed. When viewed on a plane, the active area DP-AA may overlap the active area DD-AA (see FIG. 1) of the electronic device DD (see FIG. 1), and the peripheral area DP-NAA may overlap the peripheral area DD-NAA (see FIG. 1) of the electronic device DD (see FIG. 1).

The display layer DP may include a base layer SUB, a plurality of pixels PX, a plurality of signal lines GL, DL, PL, and EL, a plurality of display pads PDD, and a plurality of sensing pads PDT.

Each of plurality of pixels PX may display either a single primary color or a mixed color. The primary colors may include red, green, or blue. The mixed colors may include various colors such as white, yellow, cyan, or magenta. However, colors displayed by each of the pixels PX are not necessarily limited thereto.

The plurality of signal lines GL, DL, PL, and EL may be disposed on the base layer SUB. The plurality of signal lines GL, DL, PL, and EL may be connected to the plurality of pixels PX to transmit electrical signals to the plurality of pixels PX. The plurality of signal lines GL, DL, PL, and EL may include a plurality of scan lines GL, a plurality of data lines DL, a plurality of power lines PL, and a plurality of light emitting control lines EL. However, this is presented as an example, and components of the plurality of signal lines GL, DL, PL, and EL according to an embodiment of the inventive concept are not necessarily limited thereto. For example, the plurality of signal lines GL, DL, PL, and EL according to an embodiment of the inventive concept may further include initialization voltage lines.

A power pattern VDD may be disposed in the peripheral area DP-NAA. The power pattern VDD may be connected to the plurality of power lines PL. The display panel DP may include the power pattern VDD to provide the same power signal to the plurality of pixels PX.

The plurality of display pads PDD may be disposed in the peripheral area DP-NAA. The plurality of display pads PDD may include a first pad PD1 and a second pad PD2. The first pad PD1 may be provided in plural. The plurality of first pads PD1 may be connected to the plurality of data lines DL, respectively. The second pad PD2 may be connected to the power pattern VDD to be electrically connected to the plurality of power line PL. The display layer DP may provide electrical signals provided from an external source through the plurality of display pads PDD to the plurality of pixels PX. The plurality of display pads PDD may further include pads for receiving other electrical signals in addition to the first pad PD1 and the second pad PD2, and are not necessarily limited to any one embodiment.

A driving circuit DIC may be mounted in the peripheral area DP-NAA. The driving circuit DIC may be a chip-type timing control circuit. The plurality of data lines DL may be electrically connected to the plurality of first pads PD1 through the driving circuit DIC, respectively. However, this is presented as an example, and the driving circuit DIC according to an embodiment of the inventive concept may be mounted on a separate film from the display layer DP. In this case, the driving circuit DIC may be electrically connected to the plurality of display pads PDD through the film.

The plurality of sensing pads PDT may be disposed in the peripheral area DP-NAA. The plurality of sensing pads PDT may be electrically connected to a plurality of sensing electrodes of the sensor layer IS (see FIG. 3), respectively, which is described below. The plurality of sensing pads PDT may include a plurality of first sensing pads TD1 and a plurality of second sensing pads TD2.

Figure 4:
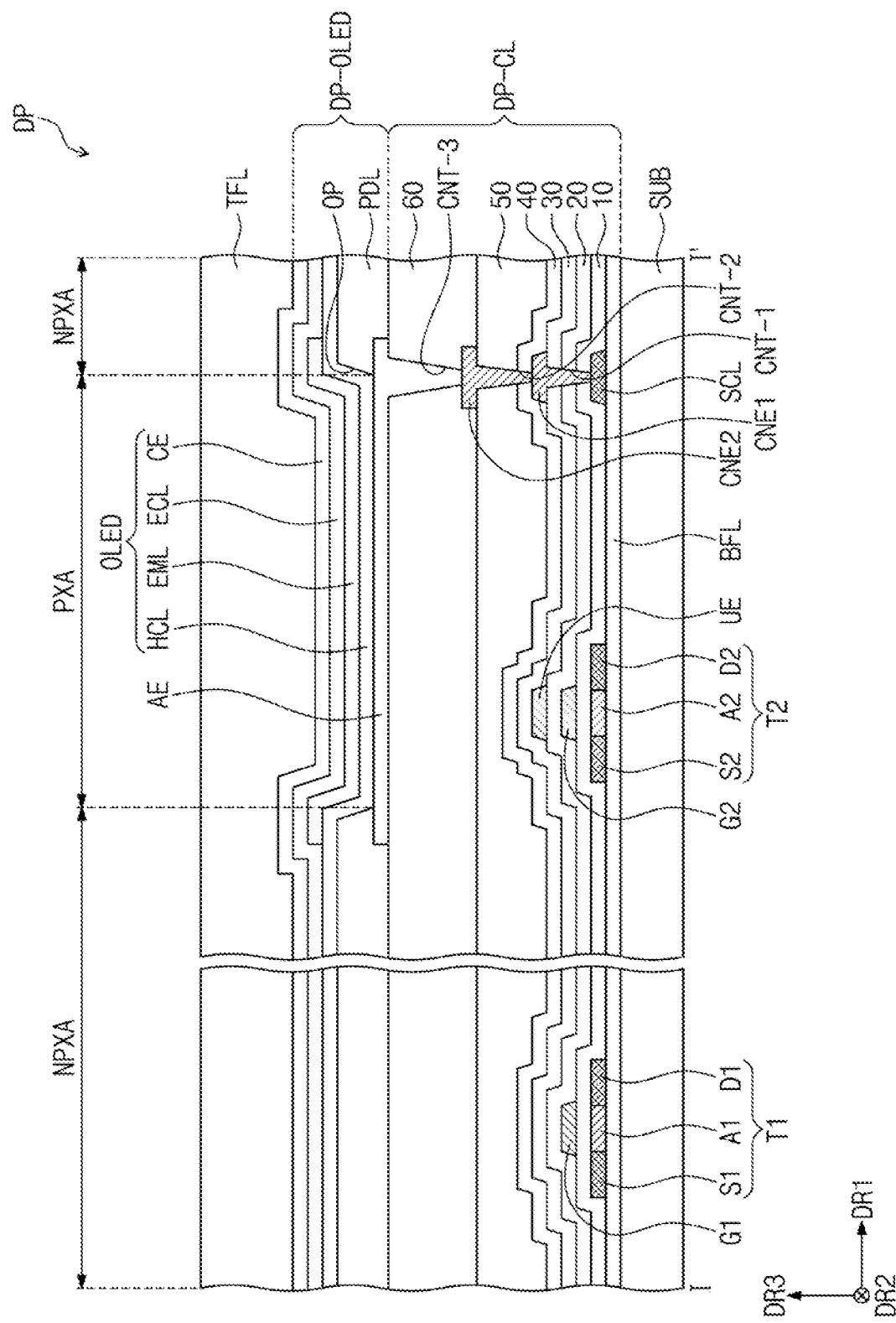
FIG. 4 is a cross-sectional view illustrating a portion corresponding to a display layer taken along line I-I' of FIG. 1 according to an embodiment of the inventive concept.

FIG. 4 is a cross-sectional view of a portion corresponding to a display layer taken along line I-I' of FIG. 1 according to an embodiment of the inventive concept.

Referring to FIG. 4, the display layer DP may include a base layer SUB, a display circuit layer DP-CL, an image realization layer DP-OLED, and a thin film encapsulation layer TFL. The display layer DP may include a plurality of insulating layers, a semiconductor pattern, a conductive pattern, and a signal line. An insulating layer, a semiconductor layer, and a conductive layer may be formed through methods such as coating or vapor deposition. Thereafter, the insulating layer, the semiconductor layer, and the conductive layer may be selectively patterned through a photolithography method. As such, a semiconductor pattern, a conductive pattern, a signal line, etc. included in the display circuit layer DP-CL and the image realization layer DP-OLED may be formed. The base layer SUB may be a base substrate supporting the display circuit layer DP-CL and the image realization layer DP-OLED.

The base layer SUB may include a synthetic resin layer. The synthetic resin layer may include a thermosetting resin. The base layer SUB may have a multilayer structure. For example, the base layer SUB may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The first and second synthetic resin layers may each include a polyimide-based resin. In addition, the first and second synthetic resin layers may each include an acrylic-based resin, a methacrylate-based resin, a polyisoprene-based resin, a vinyl-based resin, an epoxy-based resin, a urethane-based resin, a cellulose-based resin, a siloxane-based resin, a polyamide-based resin, and/or a perylene-based resin. As used herein, a "~~"-based resin indicates that a functional group of "~~" is included. In addition, the base layer SUB may include a glass substrate or an organic/inorganic composite material substrate.

At least one inorganic layer may be disposed on an upper surface of the base layer SUB. The inorganic layer may include aluminum oxide, titanium oxide, silicon oxide, silicon oxynitride, zirconium oxide, and/or hafnium oxide. The inorganic layer may be formed as multiple layers. The multi-layered inorganic layers may include a barrier layer and/or a buffer layer. In the present embodiment, the display layer DP is illustrated to include a buffer layer BFL.

The circuit layer DP-CL may be disposed on the base layer SUB. The display circuit layer DP-CL may provide signals for driving a light emitting element OLED included in the image realization layer DP-OLED. The display circuit layer DP-CL may include a buffer layer BFL, a first transistor T1, a second transistor T2, a first insulating layer 10, a second insulating layer 20, a third insulating layer 30, a fourth insulating layer 40, a fifth insulating layer 50, and a sixth insulating layer 60.

The buffer layer BFL may increase the bonding force between the base layer SUB and the semiconductor pattern. The buffer layer BFL may include a silicon oxide layer and a silicon nitride layer. The silicon oxide layer and the silicon nitride layer may be alternately stacked.

The semiconductor pattern may be disposed on the buffer layer BFL. The semiconductor pattern may include poly-silicon. However, the present invention is not necessarily limited thereto, and the semiconductor pattern may include amorphous silicon or metal oxide.

FIG. 4 illustrates only a portion of a semiconductor pattern, and semiconductor patterns may be further disposed in other areas of a pixel PX on a plane. The semiconductor pattern may be arranged by specific rules over the plurality of pixels PX. The semiconductor pattern may have different electrical properties according to whether/how various regions are doped. The semiconductor pattern may include a first area having high electrical conductivity and a second area having low electrical conductivity. The first area may be doped with an N-type dopant or a P-type dopant. A P-type transistor may include an area doped with the P-type dopant, and a N-type transistor may include an area doped with the N-type dopant. The second area may be a non-doped area or may be doped in a lower concentration than the first area.

The first area has greater electrical conductivity than the second area, and may substantially serve as an electrode or a signal line. The second area may substantially correspond to an active region (or a channel) of a transistor. For example, a portion of a semiconductor pattern may be an active region of the transistor, another portion may be a source or drain of the transistor, and the other portion may be a connection electrode or a connection signal line.

The plurality of pixels may each have an equivalent circuit including seven transistors, one capacitor, and a light emitting element, and an equivalent circuit diagram of the pixels may be modified in various forms. FIG. 4 illustrates two transistors T1 and T2 and a light emitting element OLED included in each of the plurality of pixels PX (see FIG. 4A) as an example. The first transistor T1 may include a source S1, an active region A1, a drain D1, and a gate G1. The second transistor T2 may include a source S2, an active region A2, a drain D2, a gate G2, and an upper electrode UE.

The source S1, the active region A1, and the drain D1 of the first transistor T1 may be formed from the semiconductor pattern, and the source S2, the active region A2, and the drain D2 of the second transistor T2 may be formed from the semiconductor pattern. The sources S1 and S2 and the drains D1 and D2 may extend in opposite directions from the active regions A1 and A2 on a cross section. FIG. 4 illustrates a portion of a connection signal line SCL formed from the semiconductor pattern. The connection signal line SCL may be electrically connected to the drain DR of the transistor T2 on a plane.

The first insulating layer 10 may be disposed on the buffer layer BFL. The first insulating layer 10 may commonly overlap the plurality of pixels PX and cover the semiconductor pattern. The first insulating layer 10 may be an inorganic layer and/or an organic layer, and have a single-layer or multi-layer structure. The first insulating layer 10 may include aluminum oxide, titanium oxide, silicon oxide, silicon nitride, silicon oxynitride, zirconium oxide, and/or hafnium oxide. In the present embodiment, the first insulating layer 10 may be a single-layered silicon oxide layer. An insulating layer of the display circuit layer DP-CL, which is described below, in addition to the first insulating layer 10, may be an inorganic layer and/or an organic layer, and may have a single-layer or multi-layer structure. The inorganic layer may include at least one of the materials described above.

The gates G1 and G2 may be disposed on the first insulating layer 10. The gates G1 and G2 may be a portion of a metal pattern. The gates G1 and G2 may overlap the active regions A1 and A2. In the process of doping the semiconductor pattern, the gates G1 and G2 may be the same as a mask.

The second insulating layer 20 may be disposed on the first insulating layer 10. The second insulating layer 20 may cover the gates G1 and G2. The second insulating layer 20 may commonly overlap the plurality of pixels PX. The second insulating layer 20 may be an inorganic layer and/or an organic layer, and may have a single-layer or multi-layer structure. In the present embodiment, the second insulating layer 20 may be a single-layered silicon oxide layer.

The upper electrode UE may be disposed on the second insulating layer 20. The upper electrode UE may overlap the gate G2. The upper electrode UE may be a portion of a metal pattern. A portion of the gate G2 and the upper electrode UE overlapping the portion may define a capacitor. However, this is presented as an example, and the upper electrode UE according to an embodiment of the inventive concept may be omitted.

The third insulating layer 30 may be disposed on the second insulating layer 20. The third insulating layer 30 may cover the upper electrode UE. In the present embodiment, the third insulating layer 30 may be a single-layered silicon oxide layer. A first connection electrode CNE1 may be disposed on the third insulating layer 30. The first connection electrode CNE1 may be connected to the connection signal line SCL through a contact hole CNT-1 passing through the first to third insulating layers 10, 20, and 30.

The fourth insulating layer 40 may be disposed on the third insulating layer 30. The fourth insulating layer 40 may cover the first connection electrode CNE1. The fourth insulating layer 40 may be a single-layered silicon oxide layer.

The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

The sixth insulating layer 60 may be disposed on the fifth insulating layer 50. The sixth insulating layer 60 may cover the second connection electrode CNE2. The sixth insulating layer 60 may be an organic layer.

The image realization layer DP-OLED may include a first electrode AE, a pixel defining film PDL, and a light emitting element OLED.

The first electrode AE may be disposed on the sixth insulating layer 60. The first electrode AE may be connected to the second connection electrode CNE2 through a contact hole CNT-3 passing through the sixth insulating layer 60.

An opening OP may be defined in the pixel defining film PDL. The opening OP of the pixel defining film PDL may expose at least a portion of the first electrode AE.

The active area DP-AA (see FIG. 3) may include a light emitting area PXA and a light blocking area NPXA adjacent to the light emitting area PXA. The light blocking area NPXA may at least partially surround the light emitting area PXA. In the present embodiment, the light emitting area PXA is defined to correspond to a portion of the first electrode AE exposed through the opening OP.

A hole control layer HCL may be commonly disposed in the light emitting area PXA and the light blocking area NPXA. The hole control layer HCL may include a hole transport layer, and may further include a hole injection layer. An emission layer EML may be disposed on the hole control layer HCL. The emission layer EML may be disposed in an area corresponding to the opening OP. For example, the emission layer EML may be separately formed in each of the pixels.

An electron control layer ECL may be disposed on the emission layer EML. The electron control layer ECL may include an electron transport layer and may further include an electron injection layer. The hole control layer HCL and the electron control layer ECL may be commonly formed in the plurality of pixels using an open mask. A second electrode CE may be disposed on the electron control layer ECL. The second electrode CE may have a single-body shape (e.g., may be formed of a singular continuous component). The second electrode CE may be commonly disposed in the plurality of pixels.

The thin film encapsulation layer TFL may be disposed on the image realization layer DP-OLED to cover the image realization layer DP-OLED. The thin film encapsulation layer TFL may include a first inorganic layer, an organic layer, and a second inorganic layer which are sequentially stacked along the third direction DR3. However, this is presented as an example, and the thin film encapsulation layer TFL according to an embodiment of the inventive concept is not necessarily limited thereto. For example, the thin film encapsulation layer TFL, according to an embodiment of the inventive concept, may further include a plurality of inorganic layers and a plurality of organic layers.

The first inorganic layer may prevent external moisture or oxygen from being introduced into the image realization layer DP-OLED. For example, the first inorganic layer may include silicon nitride, silicon oxide, or a combination thereof.

The organic layer may be disposed on the first inorganic layer to provide a planar surface. Unevenness formed on an upper surface of the first inorganic layer or particles present on the first inorganic layer may be covered through the organic layer. For example, the organic layer may include an acrylic-based organic layer, but is not necessarily limited thereto.

The second inorganic layer may be disposed on the organic layer to cover the organic layer. The second inorganic layer may encapsulate moisture, etc. released from the organic layer to prevent the moisture, etc. from being introduced therethrough. The second inorganic layer may include silicon nitride, silicon oxide, or a combination thereof.

Figure 5:
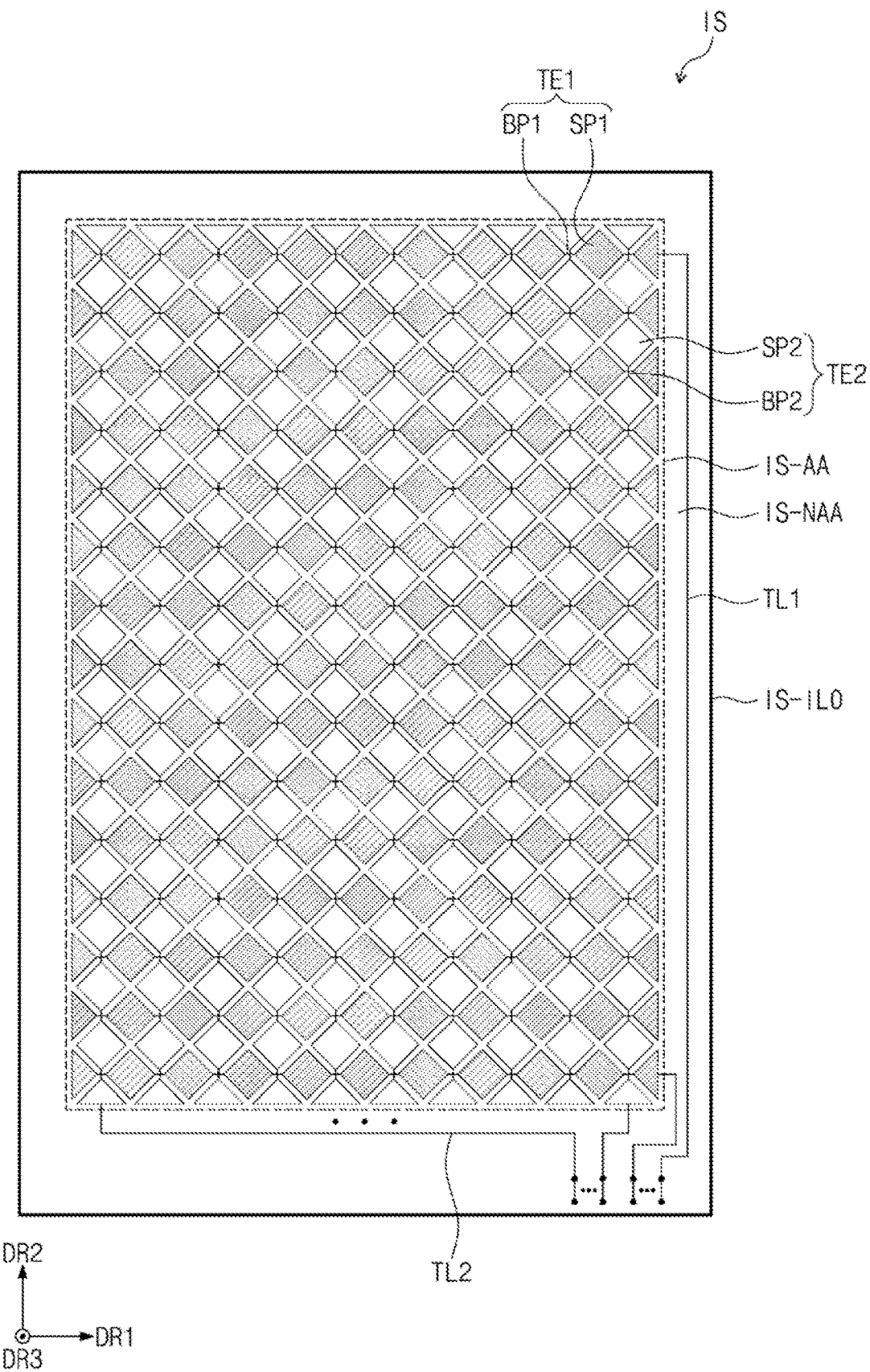
FIG. 5 is a plan view illustrating a sensor layer according to an embodiment of the inventive concept.

FIG. 5 is a plan view of a sensor layer according to an embodiment of the inventive concept.

Referring to FIG. 5, an active area IS-AA and a peripheral area IS-NAA at least partially surrounding the active area IS-AA may be defined in the sensor layer IS. The active area IS-AA may be an area activated according to electrical signals. For example, the active area IS-AA may be an area detecting inputs. When viewed on a plane, the active area IS-AA may overlap the active area DP-AA (see FIG. 3) of the display layer DP (see FIG. 3), and the peripheral area DP-NAA may overlap the peripheral area DP-NAA (see FIG. 3) of the display layer DP (see FIG. 3).

The sensor layer IS may include a base insulating layer IS-IL0, a plurality of first sensing electrodes TE1, a plurality of second sensing electrodes TE2, and a plurality of sensing lines T1A and TL2. The plurality of first sensing electrodes TE1 and the plurality of second sensing electrodes TE2 may be disposed in the active area IS-AA, and the plurality of sensing lines TL1 and TL2 may be disposed in the peripheral area IS-NAA.

The base insulating layer IS-IL0 may be an inorganic layer including silicon nitride, silicon oxynitride, and/or silicon oxide. Alternatively, the base insulating layer IS-IL0 may be an organic layer including an epoxy resin, an acrylic resin, and/or an imide-based resin. The base insulating layer IS-IL0 may be formed directly on the display layer DP (see FIG. 3). Alternatively, the dbase insulating layer IS-IL0 may be bonded to the display layer DP by an adhesive member.

The sensor layer IS may obtain information of external inputs through changes in capacitance between the plurality of first sensing electrodes TE1 and the plurality of second sensing electrodes TE2.

The plurality of first sensing electrodes TE1 may each extend along the first direction DR1 and be arranged along the second direction DR2. The plurality of first sensing electrodes TE1 may each include a plurality of first portions SP1 and a plurality of second portions BP1. The plurality of second portions BP1 may each electrically connect two adjacent first portions SP1. The plurality of first portions SP1 and the plurality of second portions BP1 may have a mesh structure.

The plurality of second sensing electrodes TE2 may each extend along the second direction DR2, and the plurality of second sensing electrodes TE2 may be arranged along the first direction DR1. The plurality of second sensing electrode TE2 may each include a plurality of sensing patterns SP2 and a plurality of bridge patterns BP2. The plurality of bridge patterns BP2 may each electrically connect two adjacent sensing patterns SP2. The plurality of sensing patterns SP2 may have a mesh structure.

FIG. 5 illustrates that one bridge pattern BP2 is connected to two adjacent sensing patterns SP2, but the connection relationship between the plurality of bridge patterns BP2 and the plurality of sensing patterns SP2 according to an embodiment of the inventive concept is not necessarily limited thereto. For example, two sensing patterns SP2 adjacent to each other may be connected through two bridge patterns BP2.

The plurality of second portions BP1 may be disposed on a different layer from the plurality of bridge patterns BP2. The plurality of bridge patterns BP2 may insulatively cross (e.g., cross without forming an electrical connection) the plurality of first sensing electrodes TEL. For example, the plurality of second portions BP1 may insulatively cross the plurality of bridge patterns BP2, respectively.

The plurality of sensing lines TL1 and TL2 may include a plurality of first sensing lines TL1 and a plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively. The plurality of sensing lines TL1 and TL2 may each have a mesh structure.

The plurality of first sensing pads TD1 (see FIG. 3) may be electrically connected to the plurality of first sensing lines TL1 through contact holes, respectively. The plurality of second sensing pads TD2 (see FIG. 3) may be electrically connected to the plurality of second sensing lines TL2 through contact holes, respectively.

Figure 6A:
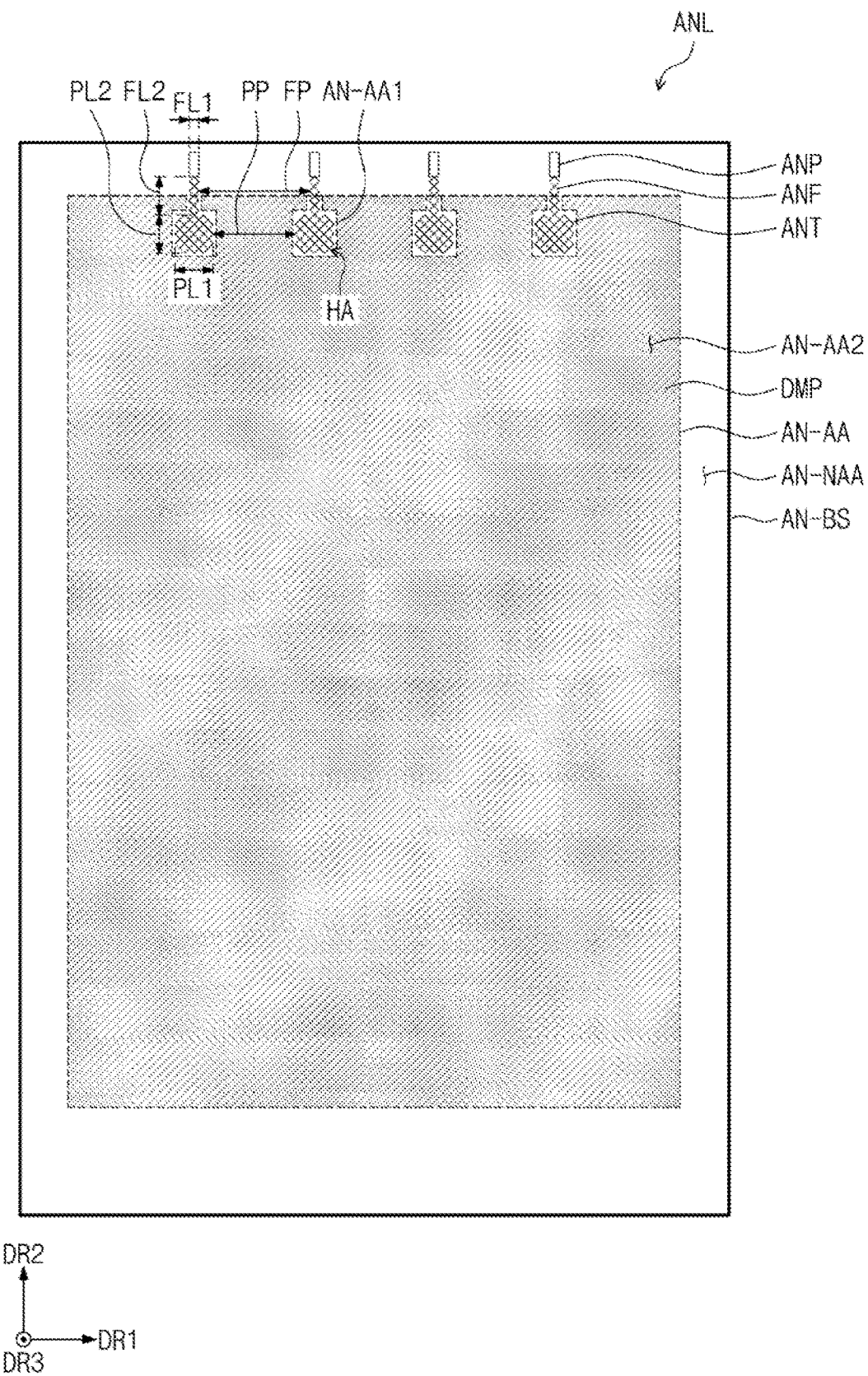
FIG. 6A is a plan view illustrating an antenna layer according to an embodiment of the inventive concept.

FIG. 6A is a plan view illustrating an antenna layer according to an embodiment of the inventive concept.

Referring to FIG. 6A, an active area AN-AA and a peripheral area AN-NAA may be defined in an antenna layer ANL. When viewed on a plane, the active area AN-AA may overlap the active area DP-AA (see FIG. 3) of the display layer DP (see FIG. 3), and the peripheral area AN-NAA may overlap the peripheral area DP-NAA (see FIG. 3) of the display layer DP (see FIG. 3).

The active area AN-AA may include at least one first area AN-AA1 and second area AN-AA2. The second area AN-AA2 may at least partially surround the first area AN-AA1.

The antenna layer ANL may include a base layer AN-BS, a plurality of antennas ANT, a plurality of antenna lines ANF, and a plurality of antenna pads ANP. At least a portion of the antenna ANT and the antenna line ANF may be disposed in the first area AN-AA1, and the remaining portion of the antenna line ANF and the antenna pad ANP may be disposed in the peripheral area AN-NAA. Even when the electronic device DD (see FIG. 1) is reduced in size or thickness, or an area of the peripheral area DD-NAA (see FIG. 1) is reduced, an area of the active area DD-AA (see FIG. 1) is secured, and a place where the antenna ANT will be disposed may thus be easily secured.

The antenna layer ANL may further include a dummy pattern DMP. The dummy pattern DMP may be disposed in at least a portion of the second area AN-AA2. When viewed on a plane, the dummy pattern may at least partially surround the antenna ANT. The dummy pattern DMP may reduce a difference in reflectance between a portion with the antenna ANT being disposed and a portion without the antenna ANT being disposed. The portion without the antenna ANT being disposed may be a portion with the dummy pattern DMP being disposed. Therefore, the antenna ANT may be prevented from being viewed from the outside.

The base layer AN-BS may include an insulating material having a predetermined dielectric constant. The base layer AN-BS may include a light transmissive film. For example, the base layer AN-BS may include an acrylic-based resin, a methacrylate-based resin, polyisoprene, a vinyl-based resin, an epoxy-based resin, a urethane-based resin, a cellulose-based resin, a siloxane-based resin, a polyamide-based resin, and/or a perylene-based resin.

The plurality of antennas ANT may be arranged along the first direction DR1. The plurality of antennas ANT may be spaced apart from each other by a first interval PP. The first interval PP may be about 3.5 mm (millimeters) to about 4 mm. For example, the first interval PP may be about 3.875 mm. FIG. 6A exemplarily illustrates that four antennas ANT are disposed in the first direction DR1 along a short side of the antenna layer ANL. The plurality of antennas ANT may be patch antennas.

The plurality of antennas ANT may operate in a predetermined frequency band. The frequency band may include a resonant frequency. The resonant frequency may be about 28 GHz (gigahertz). However, this is presented as an example, and the resonant frequency according to an embodiment of the inventive concept is not necessarily limited thereto. For example, the resonant frequency according to an embodiment of the inventive concept may vary according to a frequency band of signals to be communicated.

The plurality of antennas ANT may each have a first width PL1 in the first direction DR1 and a second width PL2 in the second direction DR2. The second width PL2 may be inversely proportional to the resonant frequency. The first width PL1 may be about 2.9 mm to about 3.3 mm. For example, the first width PL1 may be about 3.125 mm. The second width PL2 may be about 2.3 mm to about 2.7 mm. For example, the second width PL2 may be about 2.5 mm. However, this is presented as an example, and the first width PL1 and the second width PL2 each according to an embodiment of the inventive concept may be determined by a dielectric disposed below the antenna ANT and a frequency band of signals to be communicated.

The plurality of antennas ANT may overlap the plurality of first sensing electrodes TE1 (see FIG. 5) and the plurality of second sensing electrodes TE2 (see FIG. 5). The plurality of antennas ANT may overlap the active area DP-AA (see FIG. 3) of the display layer DP (see FIG. 3). The plurality of antennas ANT may each have a mesh structure in which an opening HA is defined. The opening HA may have a greater area than the pixel PX (see FIG. 3). Accordingly, images provided from the active area DP-AA (see FIG. 3) may be transmitted through the opening HA. The plurality of antennas ANT may be deformed into various shapes in the active area AN-AA, and the design freedom of the plurality of antennas ANT may be increased.

The plurality of antenna lines ANF may be respectively connected to one side of the plurality of antennas ANT. The plurality of antenna lines AN F may extend from the plurality of antennas ANT towards the peripheral area AN-NAA. The plurality of antenna lines ANF may feed the plurality of antennas ANT, respectively.

The plurality of antenna lines ANF may include the same material as the plurality of antennas ANT, and may be formed through the same process. The plurality of antennas ANT may include a carbon nanotube, a metal and/or a metal alloy, or a composite material thereof, and may have a single layer structure or a multilayer structure in which titanium (Ti), aluminum (Al), and titanium (Ti) are sequentially stacked. For example, the metal material may be silver (Ag), copper (Cu), aluminum (Al), gold (Au), or platinum (Pt), but is not necessarily limited thereto.

The plurality of antenna lines ANF may be spaced apart from each other by a second interval FP. The second interval FP may be about 6.4 mm to about 6.8 mm. For example, the second interval FP may be about 6.625 mm.

The plurality of antenna lines ANF may each have a first width FL1 in the first direction DR1 and a second width FL2 in the second direction DR2. The second width FL2 may respectively match the impedance of the plurality of antennas ANT and the plurality of antenna lines ANF. Accordingly, the display device DD (see FIG. 1) having increased signal transmission efficiency and communication efficiency between the plurality of antenna lines ANF and the plurality of antennas ANT may be provided. The first width FL1 may be about 0.275 mm to about 0.475 mm. For example, the first width FL1 may be about 0.375 mm. The second width FL2 may be about 1 mm to about 3 mm. For example, the second width FL2 may be about 2 mm.

The plurality of antenna pads ANP may be respectively connected to one side of the plurality of antenna lines ANF. The plurality of antenna pads ANP may be disposed in the peripheral area AN-NAA.

A ground electrode may be disposed below the antenna layer ANL. The ground electrode is described below.

Figure 6B:
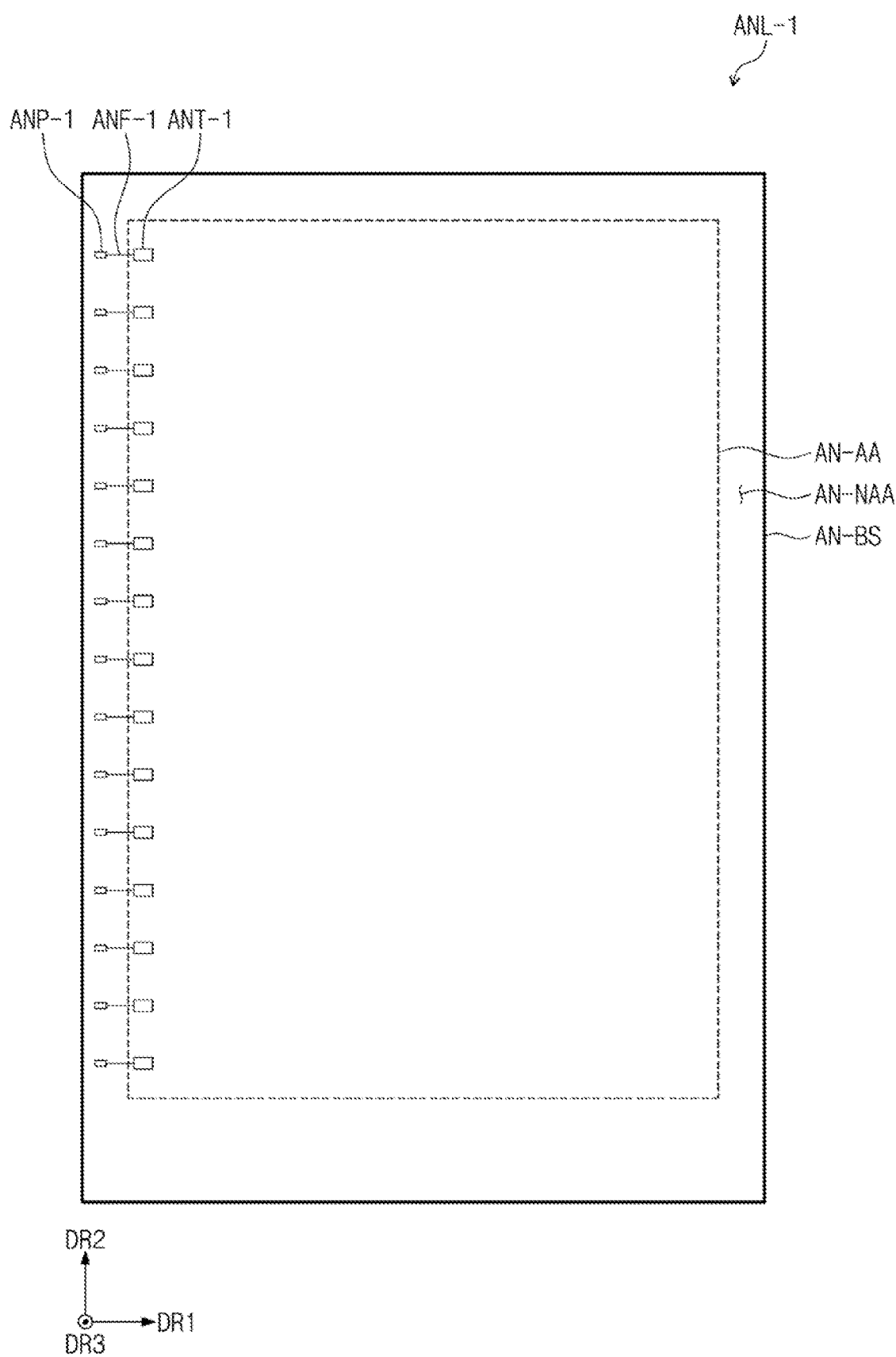
FIG. 6B is a plan view illustrating an antenna layer according to an embodiment of the inventive concept.

FIG. 6B is a plan view of an antenna layer according to an embodiment of the inventive concept. In the descriptions of FIG. 6B, the same reference numerals are given for the components described through FIG. 6A, and to the extent that a detailed description of some elements have been omitted, it may be assumed that these elements are at least similar to corresponding elements that are described elsewhere within the instant specification.

Referring to FIG. 6B, the antenna layer ANL-1 may include a base layer AN-BS, a plurality of antennas ANT-1, a plurality of antenna lines ANF-1, and a plurality of antenna pads ANP-1.

The plurality of antennas ANT-1 may overlap the second display surface DD-AA2 (see FIG. 1) of the electronic device DD (see FIG. 1). For example, the plurality of antennas ANT-1 may be provided on a bent surface of the electronic device DD (see FIG. 1). The plurality of antennas ANT-1 may be arranged in the second direction along a long side of the antenna layer ANL-1. However, this is presented as an example, and a structure in which the plurality of antennas ANT-1 are disposed is not particularly limited. The plurality of antennas ANT-1 may have a mesh structure.

Figure 7:
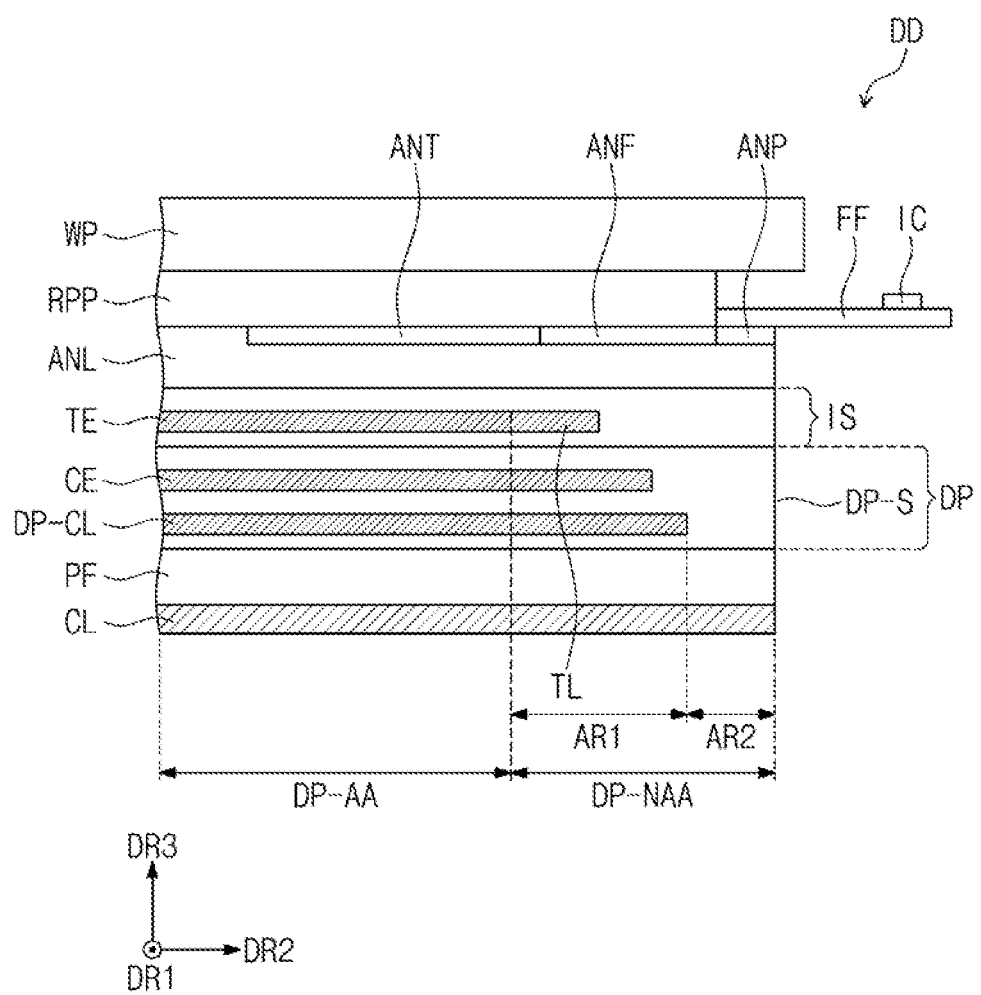
FIG. 7 is a cross-sectional view illustrating an electronic device according to an embodiment of the inventive concept.

FIG. 7 is a cross-sectional view of an electronic device according to an embodiment of the inventive concept. In the descriptions of FIG. 7, the same reference numerals are given for the components described through FIG. 2, and to the extent that a detailed description of some elements have been omitted, it may be assumed that these elements are at least similar to corresponding elements that are described elsewhere within the instant specification.

Referring to FIG. 7, the electronic device DD may include a window WP, an anti-reflection layer RPP, an antenna layer ANL, a flexible circuit board FF, a driving chip IC, a sensor layer IS, a display layer DP, a protective layer PF, and a cover layer CL.

The antenna layer ANL may include an antenna ANT, an antenna line ANF, and an antenna pad ANP. The antenna ANT may be disposed on one side of the antenna line ANF, and the antenna pad ANP may be disposed on the other side.

The flexible circuit board FF may be electrically connected to the antenna pad ANP. The flexible circuit board FF may have a coplanar wave guide (CPW) structure. The flexible circuit board FF may be bent and disposed on a lower surface of the cover layer CL. The driving chip IC may be mounted on the flexible circuit board FF. The flexible circuit board FF may transmit signals generated from the driving chip IC to the antenna ANT.

The driving chip IC may provide signals to the antenna ANT. The driving chip IC may control the operation of the antenna ANT. For example, the driving chip IC may control power fed to each of the plurality of antennas ANT to control the beam steering of the plurality of antennas ANT, and may focus frequency signals in a specific direction to increase energy. In addition, a desired radiating pattern may be formed, and radiating efficiency may thus be increased. In an embodiment of the inventive concept, the driving chip IC may be referred to as a beamforming chip IC. The driving chip IC may transmit signals to the antenna pad ANP through the flexible circuit board FF. The signals may be fed to the antenna ANT through the flexible circuit board FF and the antenna pad ANP.

The sensor layer IS may be disposed below the antenna layer ANL. The sensor layer IS may include a plurality of sensing electrodes TE and a plurality of sensing lines TL. The plurality of sensing electrodes TE and the plurality of sensing lines TL may be electrically conductive.

The plurality of sensing electrodes TE may include the plurality of first sensing electrodes TE1 (see FIG. 5) and the plurality of second sensing electrodes TE2 (see FIG. 5). The plurality of sensing lines TL may include the plurality of first sensing lines TL1 (see FIG. 5) and the plurality of second sensing lines TL2 (see FIG. 5).

When viewed on a plane, the plurality of sensing electrodes TE1 and the plurality of sensing lines TL may overlap at least a portion of the antenna ANT and the antenna line ANF. The plurality of sensing electrodes TE1 and the plurality of sensing lines TL may operate as a first ground electrode for the antenna ANT.

The display layer DP may be disposed below the sensor layer IS. An active area DP-AA and a peripheral area DP-NAA may be defined in the display layer DP. The display layer DP may include a common electrode CE and a display circuit layer DP-CL. The common electrode CE may be the same as the second electrode CE (see FIG. 4). The common electrode CE and the display circuit layer DP-CL may be electrically conductive.

When viewed on a plane, the common electrode CE may overlap at least a portion of the antenna ANT and the antenna line ANF. The display circuit layer DP-CL may overlap at least a portion of the antenna ANT and the antenna line ANF. The common electrode CE and the display circuit layer DP-CL may operate as a second ground electrode for the antenna ANT.

A ground voltage may be provided to the common electrode CE. However, this is presented as an example, and a voltage for driving the plurality of pixels PX (see FIG. 4) of the display layer DP may be provided to the common electrode CE.

Unlike embodiments of the inventive concept, when the common electrode CE or the display circuit layer DP-CL is disposed extending to a side surface DP-S of the display layer DP, when cutting the display layer DP using laser in the manufacture of the display layer DP, the reliability of laser cutting may be deteriorated due to the metal of the common electrode CE or the display circuit layer DP-CL. However, according to an embodiment of the inventive concept, the common electrode CE and the display circuit layer DP-CL may be spaced apart from the side surface DP-S of the display layer DP in the second direction DR2. Accordingly, the reliability in the manufacture of the display layer DP may be enhanced.

The peripheral area DP-NAA may include a first area AR1 adjacent to the active area DP-AA, and a second area AR2 spaced apart from the active area DP-AA in the second direction DR2 with the first area AR1 therebetween.

When viewed on a plane, the common electrode CE may overlap the active area DP-AA and the first area AR1 and might not overlap the second area AR2. The common electrode CE may be spaced apart from the second area AR2.

When viewed on a plane, the display circuit layer DP-CL may overlap the first area AR1 and might not overlap the second area AR2. The display circuit layer DP-CL may be spaced apart from the second area AR2.

The protective layer PF may be disposed below the display layer DP.

The cover layer CL may be disposed below the protective layer PF. For example, the cover layer CL may be disposed directly on a lower surface of the protective layer PF. The cover layer CL may be electrically conductive. For example, the cover layer CL may include copper (Cu). The cover layer CL may overlap the antenna ANT, the antenna line ANF, and the antenna pad ANP. The cover layer CL may operate as a third ground electrode for the antenna ANT. When viewed on a plane, the cover layer CL may overlap the active area DP-AA, the first area AR1, and the second area AR2.

A ground voltage may be provided to the cover layer CL. However, this is presented as an example, and driving for the cover layer CL to operate as a ground electrode according to an embodiment of the inventive concept is not necessarily limited thereto. For example, the cover layer CL may be electrically floating.

According to an embodiment of the inventive concept, the cover layer CL may cover the antenna ANT, the antenna line ANF, and the antenna pad ANP. The cover layer CL may operate as a ground electrode for the antenna ANT. The cover layer CL may overlap the antenna ANT, the antenna line ANF, and the antenna pad ANP. Ranges in which the antenna ANT may radiate frequency signals may extend to an area where the antenna pad ANP is disposed. Accordingly, the electronic device DD having increased frequency signal radiation performance may be provided.

Figure 8A:
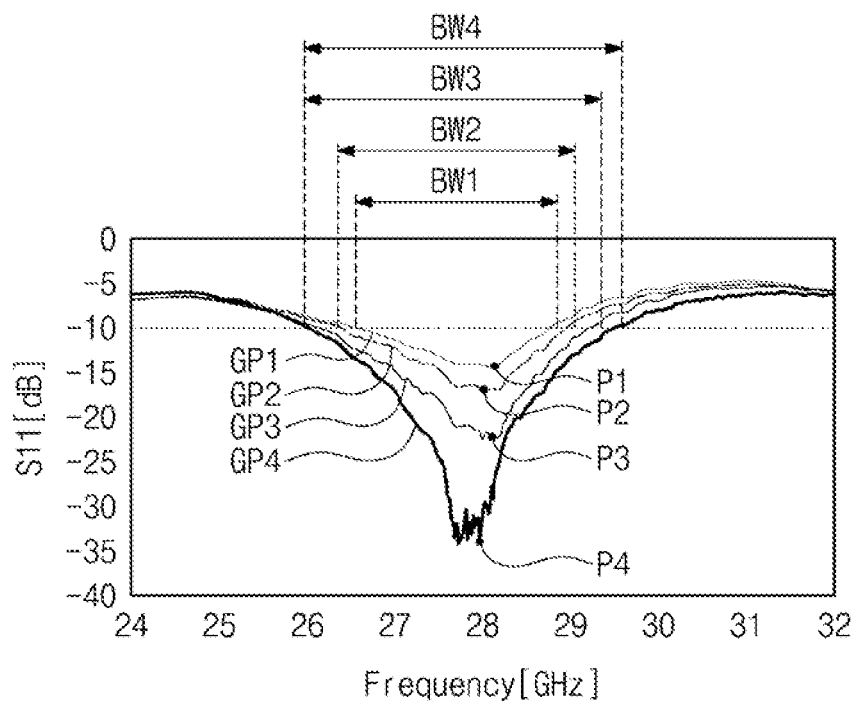
FIGS. 8A and 8B are graphs illustrating S parameters according to frequencies of an antenna according to an embodiment of the inventive concept.

FIG. 8A is a graph showing S parameters according to frequencies of an antenna according to an embodiment of the inventive concept.

Referring to FIGS. 7 and 8A, S11 may be one of S-parameters. S11 may be values representing a magnitude of signals returned from reflected input signals to a magnitude of the input signals as a ratio. For example, S11 may be a reflection coefficient of the antenna ANT. The operation of the antenna ANT may be determined based on a value of −10 dB (decibel) for S11. −10 dB may refer to a case in which the magnitude of signals returned from the reflected input signals is 10% of the magnitude of the input signals. When S11 is less than −10 dB, it may be determined that the antenna ANT operates in the corresponding frequency band and transmits, receives, or transmits/receives signals including the corresponding frequency band.

The S parameter of the antenna ANT of the electronic device without the cover layer CL being disposed may be a first graph GPL. In the first graph GP1, the antenna ANT may radiate a first signal. The first signal may include a first frequency band BW1 including a first resonant frequency. The S11 value for a first peak P1 of the first graph GP1 may be about −14.5 dB. In this case, the first resonant frequency may be about 28.1 GHz. The first frequency band BW1 may be about 2.2 GHz.

When viewed on a plane, the S parameter of the antenna ANT of the electronic device with the cover layer CL partially overlapping only a portion of the antenna line ANF may be a second graph GP2. In the second graph GP2, the antenna ANT may radiate a second signal. The second signal may include a second frequency band BW2 including a second resonant frequency. The S1 value for a second peak P2 of the second graph GP2 may be about −17.2 dB. In this case, the second resonant frequency may be about 28.0 GHz. The second frequency band BW2 may be about 2.6 GHz.

The S1 1 value for the second peak P2 may be less than the S11 value for the first peak P1. For example, the antenna gain of an electronic device with the cover layer CL only partially overlapping the antenna line ANF may be greater than the antenna gain of an electronic device without the cover layer CL being disposed. The second frequency band BW2 may be greater than the first frequency band BW1. According to an embodiment of the inventive concept, when the cover layer CL overlaps at least a portion of the antenna line ANF, compared to when the cover layer CL is not disposed, the gain of the antenna ANT may be increased and the frequency bandwidth may be increased.

When viewed on a plane, the S parameter of the antenna ANT of the electronic device with the cover layer CL overlapping the antenna line ANF and not overlapping the antenna pad ANP may be a third graph GP3. In the third graph GP3, the antenna ANT may radiate a third signal. The third signal may include a third frequency band BW3 including a third resonant frequency. The S11 value for a third peak P3 of the third graph GP3 may be about −22.7 dB. In this case, the third resonant frequency may be about 28.1 GHz. The third frequency band BW3 may be about 3.2 GHz.

The S11 value for the third peak P3 may be less than the S1 1 value for the second peak P2. For example, the antenna gain of an electronic device with the cover layer CL overlapping the antenna line ANF and not overlapping the antenna pad ANP may be greater than the antenna gain of an electronic device with the cover layer CL only partially overlapping the antenna line ANF. The third frequency band BW3 may be greater than the second frequency band BW2. According to an embodiment of the inventive concept, when the cover layer CL overlaps the antenna line ANF, compared to when the cover layer CL overlaps at least a portion of the antenna line ANF, the gain of the antenna ANT may be increased and the frequency bandwidth may be increased.

When viewed on a plane, the S parameter of the antenna ANT of the electronic device with the cover layer CL overlapping the antenna line ANF and the antenna pad ANP may be a fourth graph GP4. In the fourth graph GP4, the antenna ANT may radiate a fourth signal. The fourth signal may include a fourth frequency band BW4 including a fourth resonant frequency. The S11 value for a fourth peak P4 of the fourth graph GP4 may be about −34.3 dB. In this case, the fourth resonant frequency may be about 28.0 GHz. The fourth frequency band BW4 may be about 3.5 GHz.

The S11 value for the fourth peak P4 may be less than the vS11 value for the third peak P3. For example, the antenna gain of an electronic device with the cover layer CL overlapping the antenna line ANF and the antenna pad ANP may be greater than the antenna gain of an electronic device with the cover layer CL overlapping the antenna line ANF and not overlapping the antenna pad ANP. The fourth frequency band BW4 may be greater than the third frequency band BW3. According to an embodiment of the inventive concept, when the cover layer CL overlaps the antenna line ANF and the antenna pad ANP, compared to when the cover layer CL overlaps the antenna line ANF and does not overlap the antenna pad ANP, the gain of the antenna ANT may be increased and the frequency bandwidth may be increased.

Unlike embodiments of the inventive concept, the electronic device without the cover layer CL being disposed is not provided with a ground electrode in the second area AR2, and thus, when viewed on a plane, a portion of the antenna line ANF and the antenna pad ANP do not overlap the ground electrode. However, according to an embodiment of the inventive concept, the cover layer CL may be disposed below the display layer DP. When viewed on a plane, with an increase in an area where the cover layer CL overlaps the antenna ANT, the antenna line ANF, and the antenna pad ANP, the gain of the antenna ANT may be increased, and the frequency bandwidth may be increased. Accordingly, the electronic device DD having increased frequency signal radiation performance may be provided.

Figure 8B:
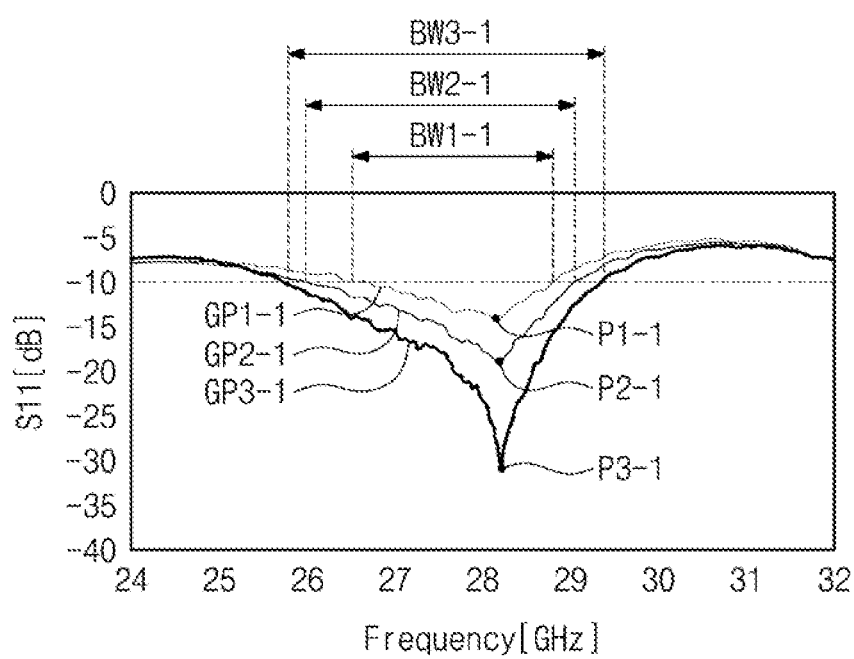

FIG. 8B is a graph showing S parameters according to frequencies of an antenna according to an embodiment of the inventive concept. In the descriptions of FIG. 8B, the same reference numerals are given for the components described through FIG. 8A, and to the extent that a detailed description of some elements have been omitted, it may be assumed that these elements are at least similar to corresponding elements that are described elsewhere within the instant specification.

Referring to FIGS. 7 and 8B, the S parameter of the antenna ANT of the electronic device without the cover layer CL being disposed may be a fifth graph GP1-1. In the fifth graph GP1-1, the antenna ANT may radiate a fifth signal. The fifth signal may include a fifth frequency band BW1-1 including a fifth resonant frequency. The S11 value for a fifth peak P1-1 of the fifth graph GP1-1 may be about −14.5 dB. In this case, the fifth resonant frequency may be about 28.2 GHz. The fifth frequency band BW1-1 may be about 1.9 GHz.

When viewed on a plane, the S parameter of the antenna ANT of the electronic device with the cover layer CL overlapping a portion of the antenna line ANF and not overlapping another portion of the antenna line ANF and the antenna pad ANP may be a sixth graph GP2-1. In the sixth graph GP2-1, the antenna ANT may radiate a sixth signal. The sixth signal may include a sixth frequency band BW2-1 including a sixth resonant frequency. The S11 value for a sixth peak P2-1 of the sixth graph GP2-1 may be about −18.9 dB. In this case, the sixth resonant frequency may be about 28.2 GHz. The sixth frequency band BW2-1 may be about 3.0 GHz.

The S11 value for the sixth peak P2-1 may be less than the S11 value for the fifth peak P1-1. For example, the antenna gain of an electronic device with the cover layer CL overlapping a portion of the antenna line ANF and not overlapping another portion of the antenna line ANF and the antenna pad ANP may be greater than the antenna gain of an electronic device without the cover layer CL being disposed. The sixth frequency band BW2-1 may be greater than the fifth frequency band BW1-1. According to an embodiment of the inventive concept, when the cover layer CL overlaps a portion of the antenna line ANF and does not overlap another portion of the antenna line ANF and the antenna ANT, compared to when the cover layer CL is not disposed, the gain of the antenna ANT may be increased and the frequency bandwidth may be increased.

When viewed on a plane, the S parameter of the antenna ANT of the electronic device with the cover layer CL overlapping the antenna line ANF and the antenna pad ANP may be a seventh graph GP3-1. In the seventh graph GP3-1, the antenna ANT may radiate a seventh signal. The seventh signal may include a seventh frequency band BW3-1 including a seventh resonant frequency. The S11 value for a seventh peak P3-1 of the seventh graph GP3-1 may be about −30.5 dB. In this case, the seventh resonant frequency may be about 28.2 GHz. The seventh frequency band BW3-1 may be about 3.6 GHz.

The S11 value for the seventh peak P3-1 may be less than the S11 value for the sixth peak P2-1. For example, the antenna gain of an electronic device with the cover layer CL overlapping the antenna line ANF and the antenna pad ANP may be greater than the antenna gain of an electronic device with the cover layer CL overlapping a portion of the antenna line ANF and not overlapping another portion of the antenna line ANF and the antenna pad ANP. The seventh frequency band BW3-1 may be greater than the sixth frequency band BW2-1. According to an embodiment of the inventive concept, when the cover layer CL overlaps the antenna line ANF and the antenna pad ANP, compared to when the cover layer CL overlaps a portion of the antenna line ANF and does not overlap another portion of the antenna line ANF and the antenna pad ANP, the gain of the antenna ANT may be increased and the frequency bandwidth may be increased.

Figure 9:
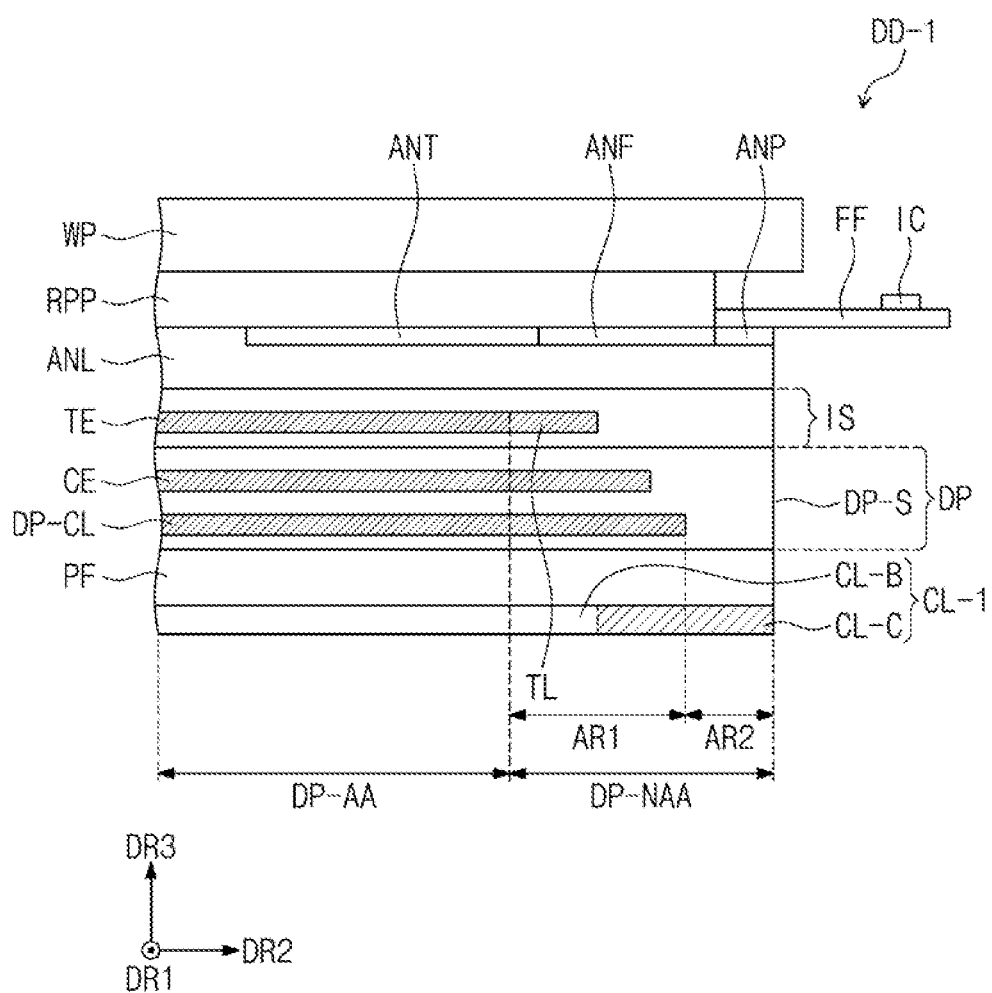
FIG. 9 is a cross-sectional view illustrating an electronic device according to an embodiment of the inventive concept.

FIG. 9 is a cross-sectional view of an electronic device according to an embodiment of the inventive concept. In the descriptions of FIG. 9, the same reference numerals are given for the components described through FIG. 7, and to the extent that a detailed description of some elements have been omitted, it may be assumed that these elements are at least similar to corresponding elements that are described elsewhere within the instant specification.

Referring to FIG. 9, a cover layer CL-1 may include a first portion CL-B overlapping the antenna ANT and a second portion CL-C extending from the first portion CL-B and overlapping the antenna line ANF and the antenna pad ANP.

The first portion CL-B may include a non-electrically conductive material.

The second portion CL-C may include a conductive material. When viewed on a plane, the second portion CL-C may overlap the second area AR2. The second portion CL-C may operate as a third ground electrode.

When viewed on a plane, a portion of the antenna ANT and the antenna line ANF may overlap a plurality of sensing electrodes TE, a plurality of sensing lines TL, a common electrode CE, and a display circuit layer DP-CL. The remaining portion of the antenna line ANF and the antenna pad ANP may overlap the second portion CL-C. The plurality of sensing electrodes TE, the plurality of sensing lines TL, the common electrode CE, the display circuit layer DP-CL, and the second portion CL-C may operate as a ground electrode for the antenna ANT. Ranges in which the antenna ANT may radiate frequency signals may extend to an area where the antenna pad ANP is disposed. Accordingly, the electronic device DD-1 having increased frequency signal radiation performance may be provided.

Figure 10:
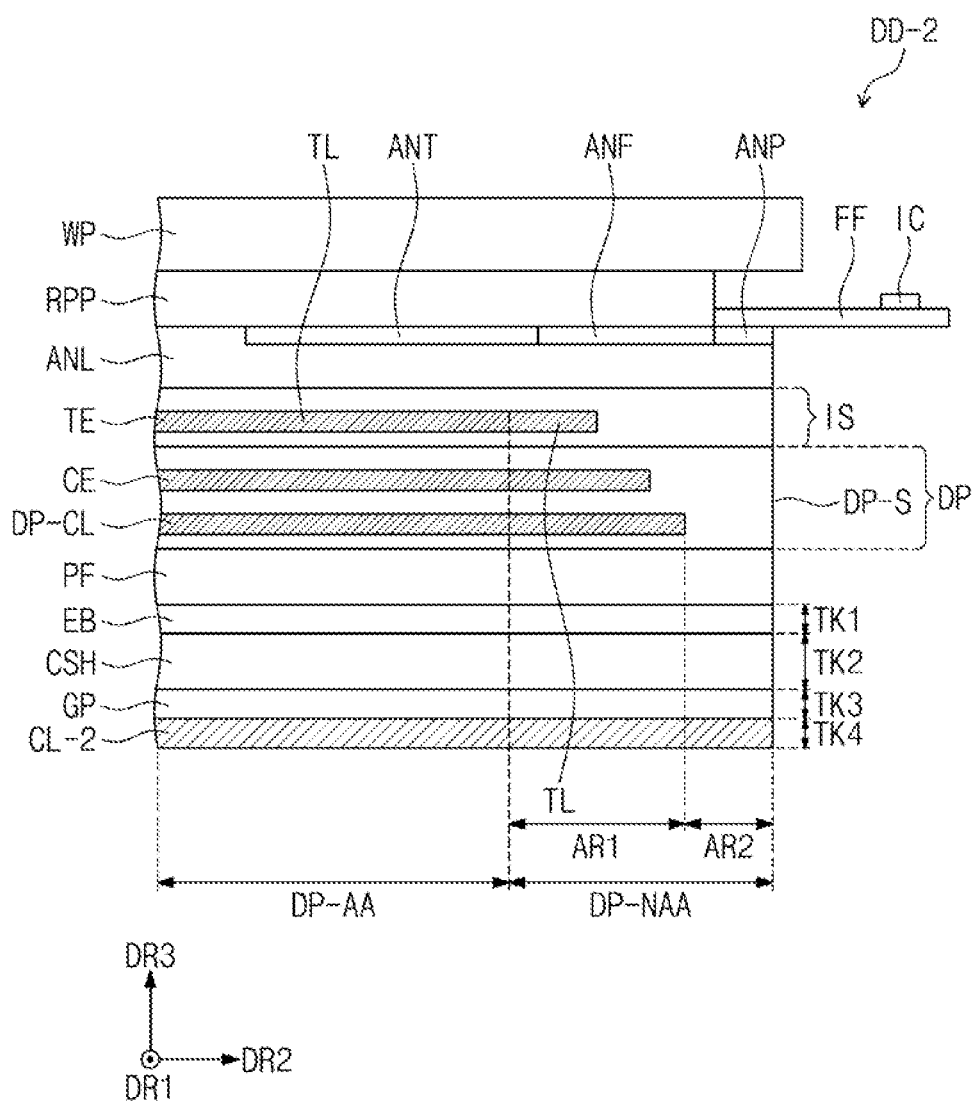
FIG. 10 is a cross-sectional view illustrating an electronic device according to an embodiment of the inventive concept.

FIG. 10 is a cross-sectional view of an electronic device according to an embodiment of the inventive concept. In the descriptions of FIG. 10, the same reference numerals are given for the components described through FIG. 7, and to the extent that a detailed description of some elements have been omitted, it may be assumed that these elements are at least similar to corresponding elements that are described elsewhere within the instant specification.

Referring to FIG. 10, an embossing layer EB may be disposed below the protective layer PF. The embossing layer EB may be colored. For example, the embossing layer EB may be black. The embossing layer EB may absorb light incident on the embossing layer EB. The embossing layer EB may be a layer having adhesiveness on both sides. The embossing layer EB may include a conventional adhesive or a gluing agent. The protective layer PF and a cushion layer CSH may be bonded together by the embossing layer EB. The embossing layer EB may have a thickness TK1 of about 0.050 mm to about 0.070 mm. For example, the thickness TK1 of the emboss layer EB may be about 0.060 mm.

The cushion layer CSH may be disposed below the embossing layer EB. The cushion layer CSH may function to reduce pressure applied from the outside. The cushion layer CSH may include a sponge, foam, or urethane resin. The cushion layer CSH may have a greater thickness than the emboss layer EB. The cushion layer CSH may have a thickness TK2 of about 0.10 mm to about 0.15 mm. For example, the thickness TK2 of the cushion layer CSH may be about 0.122 mm.

A heat dissipation sheet GP may be disposed below the cushion layer CSH. The heat dissipation sheet GP may induce the dissipation of heat generated from the display layer DP. For example, the heat dissipation sheet GP may be a graphite sheet. In an embodiment of the inventive concept, a film layer may be further disposed between the cushion layer CSH and the heat dissipation sheet GP. The film layer may include polyimide (P1). The heat dissipation sheet GP may have a thickness TK3 of about 0.022 mm to about 0.042 mm. For example, the thickness TK3 of the heat dissipation sheet GP may be about 0.032 mm.

A cover layer CL-2 may be disposed below the heat dissipation sheet GP. The cover layer CL-2 may be electrically conductive. The cover layer CL-2 may include copper (Cu). For example, the cover layer CL-2 may be a copper sheet. The cover layer CL-2 may block noise and electromagnetic waves generated in the display layer DP. The thickness TK4 of the cover layer CL-2 may be about 0.008 mm to about 0.028 mm. For example, the thickness TK4 of the cover layer CL-2 may be about 0.018 mm.

When viewed on a plane, the cover layer CL-2 may overlap the antenna ANT, the antenna line ANF, and the antenna pad ANP. The cover layer CL-2 may operate as a third ground electrode for the antenna ANT. When viewed on a plane, the cover layer CL-2 may overlap the active area DP-AA, the first area AR1, and the second area AR2.

According to an embodiment of the inventive concept, the cover layer CL-2 may cover the antenna ANT, the antenna line ANF, and the antenna pad ANP. The cover layer CL may operate as a ground electrode for the antenna ANT. The cover layer CL may overlap the antenna ANT, the antenna line ANF, and the antenna pad ANP. Ranges in which the antenna ANT may radiate frequency signals may extend to an area where the antenna pad ANP is disposed. Accordingly, the electronic device DD-2 having increased frequency signal radiation performance may be provided.

Figure 11A:
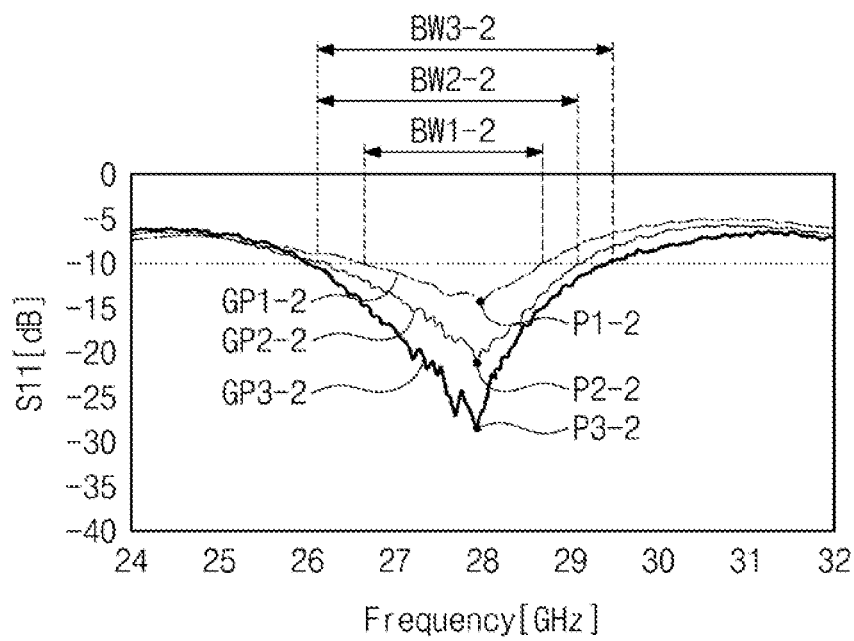
FIGS. 11A and 11B are graphs illustrating S parameters according to frequencies of an antenna according to an embodiment of the inventive concept.

FIG. 11A is a graph showing S parameters according to frequencies of an antenna according to an embodiment of the inventive concept.

Referring to FIGS. 7, 10, and 11A, the S parameter of the antenna ANT of an electronic device without the cover layers CL and CL-2 being disposed may be a first graph GP1-2. In the first graph GP1-2, the antenna ANT may radiate a first signal. The first signal may include a first frequency band BW1-2 including a first resonant frequency. The S 11 value for a first peak P1-2 of the first graph GP1-2 may be about −14.0 dB. In this case, the first resonant frequency may be about 27.9 GHz. The first frequency band BW1-2 may be about 1.9 GHz.

The S parameter of the antenna ANT of the electronic device DD-2 including the cover layer CL-2 of FIG. 10 may be a second graph GP2-2. In the second graph GP2-2, the antenna ANT may radiate a second signal. The second signal may include a second frequency band BW2-2 including a second resonant frequency. The S11 value for a second peak P2-2 of the second graph GP2-2 may be −21.0 dB. In this case, the second resonant frequency may be about 27.9 GHz. The second frequency band BW2-2 may be about 2.9 GHz.

The S11 value for the second peak P2-2 may be less than the S11 value for the first peak P1-2. For example, the antenna gain of the electronic device DD-2 may be greater than the antenna gain of the electronic device without the cover layers CL and CL-2 being disposed. The second frequency band BW2-2 may be greater than the first frequency band BW1-2.

Unlike embodiments of the inventive concept, the electronic device without the cover layer CL-2 being disposed is not provided with a ground electrode in the second area AR2, and thus, when viewed on a plane, a portion of the antenna line ANF and the antenna pad ANP does not overlap the ground electrode. However, according to an embodiment of the inventive concept, the cover layer CL-2 may be disposed below the cushion layer CSH. When viewed on a plane, with an increase in an area where the cover layer CL-2 overlaps the antenna ANT, the antenna line ANF, and the antenna pad ANP, the gain of the antenna ANT may be increased, and the frequency bandwidth may be increased. Accordingly, the electronic device DD-2 having increased frequency signal radiation performance may be provided.

The S parameter of the antenna ANT of the electronic device DD including the cover layer CL of FIG. 7 may be a third graph GP3-2. In the third graph GP3-2, the antenna ANT may radiate a third signal. The third signal may include a third frequency band BW3-2 including a third resonant frequency. The S11 value for a third peak P3-2 of the third graph GP3-2 may be about −28.6 dB. In this case, the third resonant frequency may be about 27.9 GHz. The third frequency band BW3-2 may be about 3.3 GHz. The S11 value for the third peak P3-2 may be less than the S11 value for the first peak P1-2. For example, the antenna gain of the third graph GP3-2 may be greater than the antenna gain of the first graph GP1. The third frequency band BW3-2 may be greater than the first frequency band BW1-2.

Unlike embodiments of the inventive concept, the electronic device without the cover layer CL being disposed is not provided with a ground electrode in the second area AR2, and thus, when viewed on a plane, a portion of the antenna line ANF and the antenna pad ANP does not overlap the ground electrode. However, according to an embodiment of the inventive concept, the cover layer CL may be disposed below the display layer DP. When viewed on a plane, with an increase in an area where the cover layer CL overlaps the antenna ANT, the antenna line ANF, and the antenna pad ANP, the gain of the antenna ANT may be increased, and the frequency bandwidth may be increased. Accordingly, the electronic device DD having increased frequency signal radiation performance may be provided.

Figure 11B:
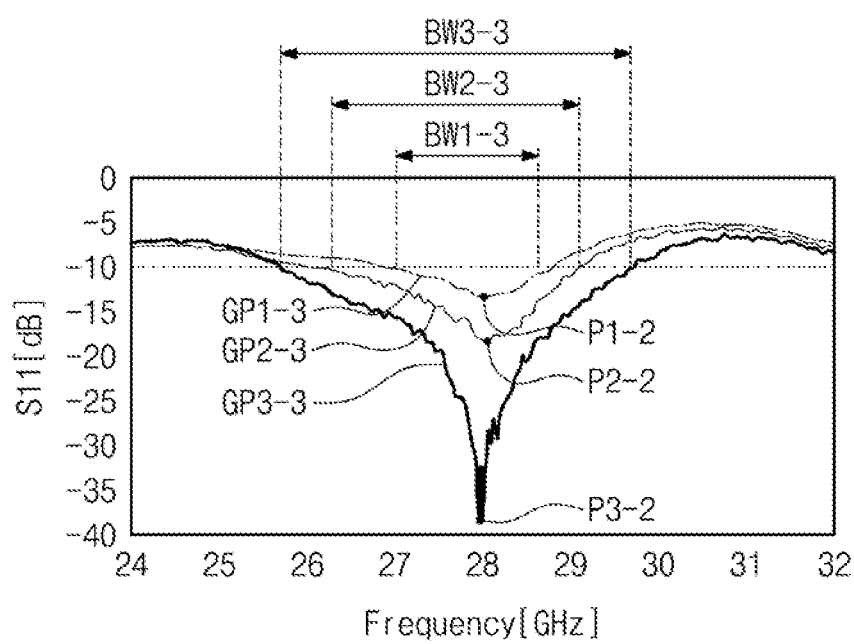

FIG. 11B is a graph showing S parameters according to frequencies of an antenna according to an embodiment of the inventive concept.

Referring to FIGS. 7, 10, and 11B, the S parameter of the antenna ANT of the electronic device without the cover layers CL and CL-2 being disposed may be a fourth graph GP1-3. In the fourth graph GP1-3, the antenna ANT may radiate a fourth signal. The fourth signal may include a fourth frequency band BW1-3 including a fourth resonant frequency. The S11 value for the fourth peak P1-3 of the fourth graph GP1-3 may be about −13.6 dB. In this case, the fourth resonant frequency may be about 28.0 GHz. The fourth frequency band BW1-3 may be about 1.8 GHz.

The S parameter of the antenna ANT of the electronic device DD-2 including the cover layer CL-2 of FIG. 10 may be a fifth graph GP2-3. In the fifth graph GP2-3, the antenna ANT may radiate a fifth signal. The fifth signal may include a fifth frequency band BW2-3 including a fifth resonant frequency. The S11 value for the fifth peak P2-3 of the fifth graph GP2-3 may be about −18.5 dB. In this case, the fifth resonant frequency may be about 28.1 GHz. The fifth frequency band BW2-3 may be about 3.0 GHz.

The S11 value for the fifth peak P2-3 may be less than the S11 value for the fourth peak P1-3. For example, the antenna gain of the electronic device DD-2 may be greater than the antenna gain of the electronic device without the cover layers CL-2 being disposed. The fifth frequency band BW2-3 may be greater than the fourth frequency band BW1-3.

Unlike embodiments of the inventive concept, the electronic device without the cover layer CL-2 being disposed is not provided with a ground electrode in the second area AR2, and thus, when viewed on a plane, a portion of the antenna line ANF and the antenna pad ANP does not overlap the ground electrode. However, according to an embodiment of the inventive concept, the cover layer CL-2 may be disposed below the cushion layer CSH. When viewed on a plane, with an increase in an area where the cover layer CL-2 overlaps the antenna ANT, the antenna line ANF, and the antenna pad ANP, the gain of the antenna ANT may be increased, and the frequency bandwidth may be increased. Accordingly, the electronic device DD-2 having increased frequency signal radiation performance may be provided.

The S parameter of the antenna ANT of the electronic device DD including the cover layer CL of FIG. 7 may be a sixth graph GP3-3. In the sixth graph GP3-3, the antenna ANT may radiate a sixth signal. The sixth signal may include a sixth frequency band BW3-3 including a sixth resonant frequency. The S 11 value for the sixth peak P3-3 of the sixth graph GP3-3 may be about −38.2 dB. In this case, the sixth resonant frequency may be about 28.0 GHz. The sixth frequency band BW3-3 may be about 4.0 GHz.

The S11 value for the sixth peak P3-3 may be less than the S1 1 value for the fourth peak P1-3. For example, the antenna gain of the electronic device DD may be greater than the antenna gain of the electronic device without the cover layer CL being disposed. The sixth frequency band BW3-3 may be greater than the fourth frequency band BW1-3.

Unlike embodiments of the inventive concept, the electronic device without the cover layer CL being disposed is not provided with a ground electrode in the second area AR2, and thus, when viewed on a plane, a portion of the antenna line ANF and the antenna pad ANP does not overlap the ground electrode. However, according to an embodiment of the inventive concept, the cover layer CL may be disposed below the display layer DP. When viewed on a plane, with an increase in an area where the cover layer CL overlaps the antenna ANT, the antenna line ANF, and the antenna pad ANP, the gain of the antenna ANT may be increased, and the frequency bandwidth may be increased. Accordingly, the electronic device DD having increased frequency signal radiation performance may be provided.

Figure 12:
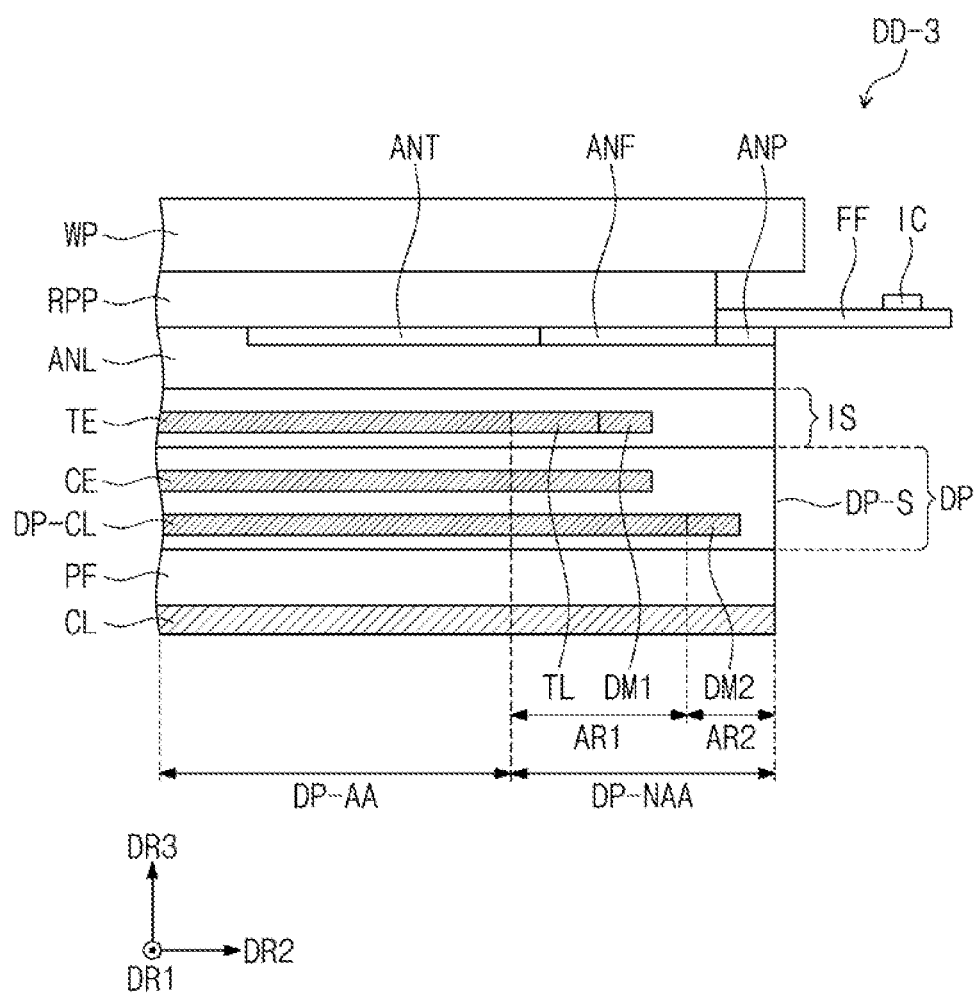
FIG. 12 is a cross-sectional view illustrating an electronic device according to an embodiment of the inventive concept.

FIG. 12 is a cross-sectional view of an electronic device according to an embodiment of the inventive concept. In the description of FIG. 12, the same reference numerals are given for the components described through FIG. 7, and to the extent that a detailed description of some elements have been omitted, it may be assumed that these elements are at least similar to corresponding elements that are described elsewhere within the instant specification.

Referring to FIG. 12, the sensor layer IS may further include a first dummy electrode DM1 overlapping the peripheral area DP-NAA. When viewed on a plane, the first dummy electrode DM1 may overlap at least a portion of the antenna line ANF.

The first dummy electrode DM1 may be spaced apart from the plurality of sensing electrodes TE with the plurality of sensing lines TL disposed therebetween. The first dummy electrode DM1 may be electrically conductive. The plurality of sensing electrodes TE, the plurality of sensing lines TL, and the first dummy electrode DM1 may operate as a first ground electrode for the antenna ANT.

The display layer DP may further include a second dummy electrode DM2 overlapping the peripheral area DP-NAA. When viewed on a plane, the second dummy electrode DM2 may overlap at least a portion of the antenna line ANF and at least a portion of the antenna pad ANP. The second dummy electrode DM2 may be spaced apart from the side surface DP-S of the display layer DP.

The second dummy electrode DM2 may extend from the display circuit layer DP-CL. The second dummy electrode DM2 may be electrically conductive. The common electrode CE, the display circuit layer DP-CL, and the second dummy electrode DM2 may operate as second ground electrodes for the antenna ANT.

According to an embodiment of the inventive concept, the cover layer CL may operate as a ground electrode for the antenna ANT. The cover layer CL may cover the antenna ANT, the antenna line ANF, and the antenna pad ANP. The cover layer CL may overlap the antenna ANT, the antenna line ANF, and the antenna pad ANP. Ranges in which the antenna ANT may radiate frequency signals may extend to an area where the antenna pad ANP is disposed. Accordingly, the electronic device DD-3 having increased frequency signal radiation performance may be provided.

Figure 13:
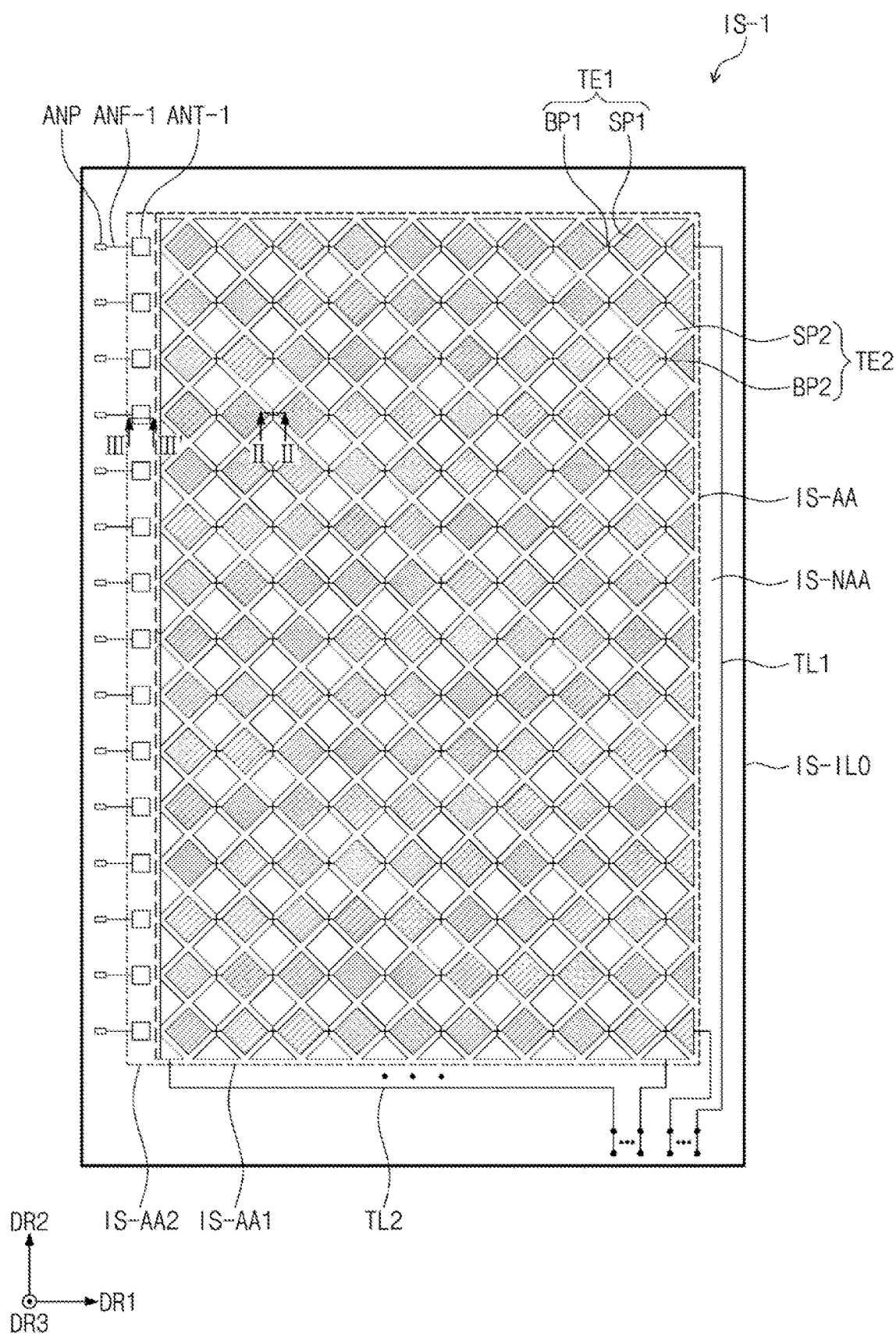
FIG. 13 is a plan view illustrating a sensor layer according to an embodiment of the inventive concept.
Figure 14A:
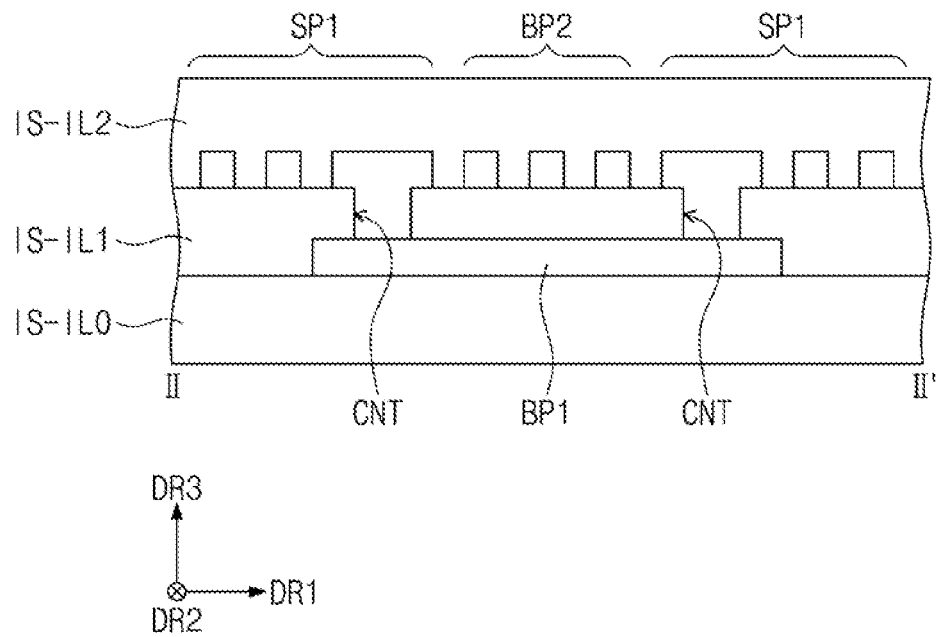
FIG. 14A is a cross-sectional view taken along line II-II' of FIG. 13 according to an embodiment of the inventive concept.
Figure 14B:
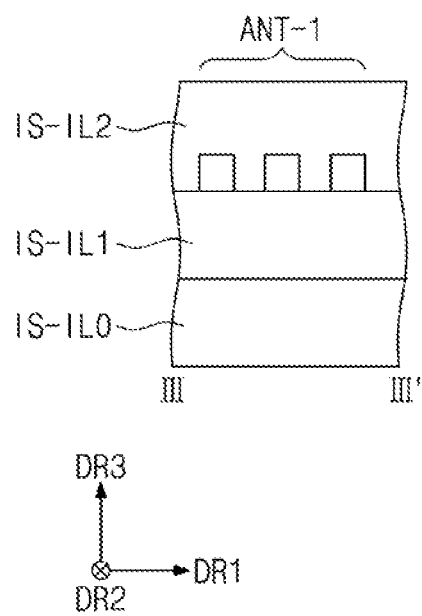
FIG. 14B is a cross-sectional view taken along line III-III' of FIG. 13 according to an embodiment of the inventive concept.

FIG. 13 is a plan view of a sensor layer according to an embodiment of the inventive concept, FIG. 14A is a cross-sectional view taken along line II-II' of FIG. 13 according to an embodiment of the inventive concept, and FIG. 14B is a cross-sectional view taken along line III-III' of FIG. 13 according to an embodiment of the inventive concept. In the descriptions of FIG. 13, the same reference numerals are given for the components described through FIG. 5, and to the extent that a detailed description of some elements have been omitted, it may be assumed that these elements are at least similar to corresponding elements that are described elsewhere within the instant specification.

Referring to FIGS. 13 to 14B, an active area IS-AA and a peripheral area IS-NAA may be defined in the sensor layer IS-1. The active area IS-AA may include a first active area IS-AA1 and a second active area IS-AA2.

A plurality of first sensing electrodes TE1 and a plurality of second sensing electrodes TE2 may be disposed in the first active area IS-AA1.

The second active area IS-AA2 may extend from one side of the first active area IS-AA1. The second active area IS-AA2 may be provided in plural. In this case, the second active area IS-AA2 may extend from at least two sides of the first active area IS-AA1. The active area IS-AA may include one first active area IS-AA1 and one to four second active areas IS-AA2. However, this is presented as an example, and the active area IS-AA according to an embodiment of the inventive concept is not necessarily limited thereto.

At least a portion of the antenna ANT-1 and the antenna line ANF-1 may be disposed in the second active area IS-AA2.

The plurality of second portions BP2 may be disposed on a different layer from the plurality of bridge patterns BP1. The plurality of bridge patterns BP1 may insulatively cross the plurality of second sensing electrodes TE2. For example, the plurality of second portions BP2 may insulatively cross the plurality of bridge patterns BP1, respectively.

The plurality of bridge patterns BP1 may be disposed on the base insulating layer IS-IL0. The first insulating layer IS-IL1 may be disposed on the plurality of bridge patterns BP1. The first insulating layer IS-IL1 may have a single layer or a multilayer structure. The first insulating layer IS-IL1 may include an inorganic material, an organic material, or a composite material.

The plurality of sensing patterns SP1, the plurality of first portions SP2, and the plurality of second portions BP2 may be disposed on the first insulating layer IS-IL1. The plurality of sensing patterns SP1, the plurality of first portions SP2, and the plurality of second portions BP2 may have a mesh structure.

The plurality of contact holes CNT may be formed when the first insulating layer IS-IL1 is passed through in the third direction DR3. Two adjacent sensing patterns SP1 among the plurality of sensing patterns SP1 may be electrically connected to the bridge pattern BP1 through the plurality of contact holes CNT.

The second insulating layer IS-IL2 may be disposed on the plurality of sensing patterns SP1, the plurality of first portions SP2, and the plurality of second portions BP2. The second insulating layer IS-IL2 may have a single layer or a multilayer structure. The second insulating layer IS-IL2 may include an inorganic material, an organic material, or a composite material.

In FIG. 14A, a bottom bridge structure in which the plurality of bridge patterns BP1 are disposed below the plurality of sensing patterns SP1, the plurality of first portions SP2, and the plurality of second portions BP2 is illustrated, but is not necessarily limited thereto. For example, the sensor layer IS-1 may have a top bridge structure in which the plurality of bridge patterns BP1 are disposed above the plurality of sensing patterns SP1, the plurality of first portions SP2, and the plurality of second portions BP2.

The plurality of antennas ANT-1 may be disposed on the same layer as some of the plurality of sensing electrodes TE1 and TE2. The plurality of antennas ANT-1 may be disposed on the first insulating layer IS-IL1. For example, the plurality of antennas ANT-1 may be disposed on the same layer as the plurality of sensing patterns SP1, the plurality of first portions SP2, and the plurality of second portions BP2. However, this is presented as an example, and the arrangement relationship of the plurality of antennas ANT-1 according to the present invention is not necessarily limited thereto. For example, the plurality of antennas ANT-1 may be disposed on the same layer as the plurality of bridge patterns BP1. The plurality of antennas ANT-1 may have a mesh structure.

According to an embodiment of the inventive concept, an electronic device may include an antenna layer having an antenna, an antenna line, and an antenna pad, a display layer disposed below the antenna layer, and a cover layer disposed below the display layer. The cover layer may operate as a ground electrode for the antenna. The cover layer may overlap the antenna, the antenna line, and the antenna pad. Ranges in which the antenna may radiate frequency signals may extend to an area where the antenna pad is disposed. Accordingly, the electronic device having increased frequency signal radiation performance may be provided.

Although the inventive concept has been described with reference to embodiments of the inventive concept, it will be understood that the inventive concept is not necessarily limited to the embodiments set forth herein but various changes and modifications can be made by those skilled in the art without departing from the spirit and scope of the inventive concept.

What is claimed is:

1. An electronic device, comprising:
a display layer including an active area and a peripheral area adjacent to the active area;
an antenna layer disposed on the display layer and including an antenna, an antenna line connected to one side of the antenna, and an antenna pad connected to one side of the antenna line; and
a cover layer spaced apart from the antenna layer with the display layer disposed therebetween,
wherein the cover layer at least partially overlaps each of the antenna, the antenna line, and the antenna pad,
wherein the cover layer is electrically conductive,
wherein the peripheral area comprises a first area adjacent to the active area and a second area spaced apart from the active area with the first area disposed therebetween,
wherein the display layer comprises a common electrode at least partially overlapping each of the active area and the first area, and
wherein, the cover layer at least partially overlaps each of the active area, the first area, and the second area.

2. The electronic device of claim 1, wherein the common electrode at least partially overlaps the antenna and the antenna line.

3. The electronic device of claim 1, wherein, the common electrode is spaced apart from the second area.

4. The electronic device of claim 1, further comprising a protective layer disposed between the display layer and the cover layer.

5. The electronic device of claim 4, wherein the cover layer is disposed directly on a lower surface of the protective layer.

6. The electronic device of claim 4, further comprising a cushion layer disposed between the protective layer and the cover layer.

7. The electronic device of claim 1, further comprising a sensor layer disposed between the display layer and the antenna layer,
wherein the sensor layer includes a plurality of sensing electrodes.

8. The electronic device of claim 7, wherein the sensor layer further comprises a dummy electrode at least partially overlapping the peripheral area, and
wherein the dummy electrode overlapping at least a portion of the antenna line.

9. The electronic device of claim 7, wherein the antenna is disposed on a same layer as at least some of the plurality of sensing electrodes.

10. The electronic device of claim 1, wherein the antenna at least partially overlaps each of the active area, and the antenna line, and
wherein the antenna pad at least partially overlaps the peripheral area.

11. The electronic device of claim 1, wherein the cover layer comprises copper.

12. The electronic device of claim 1, wherein the cover layer comprises a first portion at least partially overlapping the antenna, and a second portion extending from the first portion and at least partially overlapping each of the antenna line and the antenna pad,
wherein the first portion includes a non-electrically conductive material and the second portion includes an electrically conductive material.

13. An electronic device comprising:
an antenna layer including an antenna, an antenna line connected to one side of the antenna, and an antenna pad connected to one side of the antenna line;
a display layer disposed below the antenna layer, including a common electrode provided with a first ground voltage, the common electrode having an active area and a peripheral area adjacent to the active area; and
a cover layer disposed below the display layer and at least partially overlapping each of the antenna, the antenna line, and the antenna pad,
wherein the cover layer is electrically conductive, and
wherein the cover layer is either provided with a second ground voltage, or the cover layer is electrically floated.

14. The electronic device of claim 13, wherein the cover layer comprises copper.

15. The electronic device of claim 13, further comprising a protective layer disposed between the display layer and the cover layer, and
wherein the cover layer is disposed directly on a lower surface of the protective layer.

16. The electronic device of claim 13, wherein:
the cover layer comprises a first portion, and a second portion adjacent to the first portion;
the second portion is electrically conductive; and
the second portion at least partially overlaps each of the antenna line and the antenna pad.

17. The electronic device of claim 13, further comprising a sensor layer disposed between the display layer and the antenna layer,
wherein the sensor layer includes a plurality of sensing electrodes at least partially overlapping the active area and a dummy electrode at least partially overlapping the peripheral area, and
wherein the dummy electrode at least partially overlaps the antenna line.

18. An electronic device, comprising:
an antenna layer including an antenna, an antenna line connected to one side of the antenna, and an antenna pad connected to one side of the antenna line;
a display layer disposed below the antenna layer and including a common electrode at least partially overlapping each of the antenna and the antenna line;
a protective layer disposed below the display layer; and
a cover layer disposed below the protective layer, the cover layer at least partially overlapping each of the common electrode, the antenna line, and the antenna pad,
wherein the cover layer is electrically conductive.

19. The electronic device of claim 18, wherein the cover layer overlaps each of the antenna, the antenna line, and the antenna pad.

20. The electronic device of claim 18, further comprising a sensor layer disposed between the display layer and the antenna layer and including a plurality of sensing electrodes.

21. The electronic device of claim 18, wherein the antenna has a mesh structure.

22. An electronic device, comprising:
a display panel including an active area and a peripheral area at least partially surrounding the active area;
an antenna disposed on the display panel;
an antenna pad disposed on a same layer as the antenna;
an antenna line disposed on the same layer as the antenna and the antenna pad, the antenna line being disposed between the antenna and the antenna pad; and
a cover layer overlapping at least a portion of each of the antenna, the antenna pad, the antenna line,
wherein the cover layer is electrically conductive, and
wherein the cover layer is spaced apart from the antenna with the display panel disposed therebetween in a direction perpendicular to a major surface of the display panel.

23. The electronic device of claim 22, wherein the cover layer is grounded or floated.

24. The electronic device of claim 22, further comprising a flexible circuit board contacting the antenna pad and electrically connecting the antenna pad to a beam forming chip mounted thereon, the antenna includes a plurality of antennas, the beam forming chip is configured to control the plurality of antennas to focus frequency signals in a specific direction.

* * * * *